United States Patent
Yang et al.

(10) Patent No.: US 10,643,720 B2
(45) Date of Patent: May 5, 2020

(54) BIT LINE VOLTAGE CONTROL FOR DAMPING MEMORY PROGRAMMING

(71) Applicant: SanDisk Technologies LLC, Plano, TX (US)

(72) Inventors: Xiang Yang, Santa Clara, CA (US); Deepanshu Dutta, Fremont, CA (US); Gerrit Jan Hemink, San Ramon, CA (US); Tai-Yuan Tseng, Milpitas, CA (US); Yan Li, Milpitas, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 15/987,764

(22) Filed: May 23, 2018

(65) Prior Publication Data

US 2019/0362799 A1 Nov. 28, 2019

(51) Int. Cl.
| | | |
|---|---|---|
| G11C 11/34 | (2006.01) | |
| G11C 16/34 | (2006.01) | |
| G11C 16/10 | (2006.01) | |
| G11C 16/26 | (2006.01) | |
| G11C 16/24 | (2006.01) | |
| G11C 16/04 | (2006.01) | |
| G11C 11/56 | (2006.01) | |

(52) U.S. Cl.
CPC ...... *G11C 16/3459* (2013.01); *G11C 11/5628* (2013.01); *G11C 11/5642* (2013.01); *G11C 16/0408* (2013.01); *G11C 16/0483* (2013.01); *G11C 16/10* (2013.01); *G11C 16/24* (2013.01); *G11C 16/26* (2013.01); *G11C 2211/5621* (2013.01)

(58) Field of Classification Search
None
See application file for complete search history.

(56) References Cited

U.S. PATENT DOCUMENTS

| | | | |
|---|---|---|---|
| 7,158,421 | B2 | 1/2007 | Li |
| 7,372,732 | B2 | 5/2008 | Wu |
| 7,881,110 | B2 | 2/2011 | Park |
| 8,625,367 | B2 | 1/2014 | Yun |

(Continued)

OTHER PUBLICATIONS

Hiromi Nobukata, Shunsuke Takagi, Keizo Hiraga, Takeshi Ohgishi, Masaru Miyashita, Kazuto Kamimura Shinji Hiramatsu, Kiyohisa Sakai, Takahiro Ishida, Hideki Arakawa, Masahiko Itoh, Ihachi Naiki, and Masanori Noda, A 144-Mb, Eight-Level NAND Flash Memory with Optimized Pulsewidth Programming, Journal of Solid-State Citcuts, vol. 35, No. 5, Published May 5, 2000 (shown in attachment 1).

*Primary Examiner* — James G Norman
(74) *Attorney, Agent, or Firm* — Vierra Magen Marcus LLP

(57) ABSTRACT

An apparatus includes a programming circuit configured to supply a program pulse to increase a threshold voltage of a memory cell. The apparatus also includes a sensing circuit configured to determine that the threshold voltage of the memory cell satisfies a trigger threshold voltage in response to the program pulse. The apparatus further includes a damping circuit configured to increase a voltage of a bit line connected to the memory cell after initiation of and during a second program pulse in response to the threshold voltage of the memory cell satisfying the trigger threshold voltage, the second program pulse being sent by the programming circuit.

20 Claims, 10 Drawing Sheets

(56) References Cited

U.S. PATENT DOCUMENTS

| | | |
|---|---|---|
| 8,705,293 B2 | 4/2014 | She |
| 8,971,141 B2 | 3/2015 | Mui |
| 9,013,928 B1 | 4/2015 | Dutta |
| 9,299,443 B1 | 3/2016 | Dong |
| 9,418,751 B1 | 8/2016 | Dutta |
| 2010/0097863 A1 | 4/2010 | Kim |
| 2011/0080789 A1* | 4/2011 | Kalavade ............ G11C 11/5628 365/185.19 |
| 2012/0014184 A1 | 1/2012 | Dutta |
| 2014/0198570 A1 | 7/2014 | Hsieh |

* cited by examiner

BIT LINE VOLTAGE CONTROL FOR DAMPING MEMORY PROGRAMMING

FIELD OF THE DISCLOSURE

This disclosure is generally related to data storage devices and more particularly to bit line voltage control for damping memory programming.

BACKGROUND

Semiconductor memory has become increasingly popular for use in various electronic devices. For example, non-volatile semiconductor memory is used in cellular telephones, digital cameras, personal digital assistants, mobile computing devices, non-mobile computing devices, and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM.

Both the traditional EEPROM and flash memory utilize a floating gate that is positioned above and insulated from a channel region in a semiconductor substrate. The floating gate is positioned between the source and drain regions. A control gate is provided over and insulated from the floating gate. The threshold voltage (Vth) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

Some EEPROM and flash memory devices have a floating gate that is used to store two ranges of charges and, therefore, the memory element can be programmed/erased between two states, e.g., an erased state and a programmed state. Such a flash memory device is sometimes referred to as a binary flash memory device because each memory element can store one bit of data.

A multi-state (also called multi-level) flash memory device is implemented by identifying multiple distinct allowed/valid programmed threshold voltage ranges. Each distinct threshold voltage range corresponds to a predetermined value for the set of data bits encoded in the memory device. For example, each memory element can store two bits of data when the element can be placed in one of four discrete charge bands corresponding to four distinct threshold voltage ranges.

Techniques are needed for accurately programming the threshold voltage ranges, particularly as memory devices are scaled down.

DETAILED DESCRIPTION

Particular examples in accordance with the disclosure are described below with reference to the drawings. In the description, common features may be designated by common reference numbers. Similar or exemplary features may be designated with similar reference numbers. As used herein, "exemplary" may indicate an example, an implementation, and/or an aspect, and should not be construed as limiting or as indicating a preference or a preferred implementation. Further, it is to be appreciated that certain ordinal terms (e.g., "first" or "second") may be provided for identification and ease of reference and may not necessarily imply physical characteristics or ordering. Therefore, as used herein, an ordinal term (e.g., "first," "second," "third") used to modify an element, such as a structure, a component, an operation, etc., does not necessarily indicate priority or order of the element with respect to another element, but rather distinguishes the element from another element having a same name (but for use of the ordinal term). In addition, as used herein, indefinite articles ("a" and "an") may indicate "one or more" rather than "one." As used herein, a structure or operation that "comprises" or "includes" an element may include one or more other elements not explicitly recited. Further, an operation performed "based on" a condition or event may also be performed based on one or more other conditions or events not explicitly recited.

It should be noted that multiple similar elements may be labeled with a number and a letter (e.g., bit lines 1080a-c). When an element is referred to by the number without a letter, this may generally refer to any one of the illustrated elements with the number, to some of the illustrated elements with the number, to all of the illustrated elements with the number, or to another similar element. For example, a "bit line 1080" may generally refer to one or more of the bit lines 1080a-c illustrated in the figures.

Figure 1:
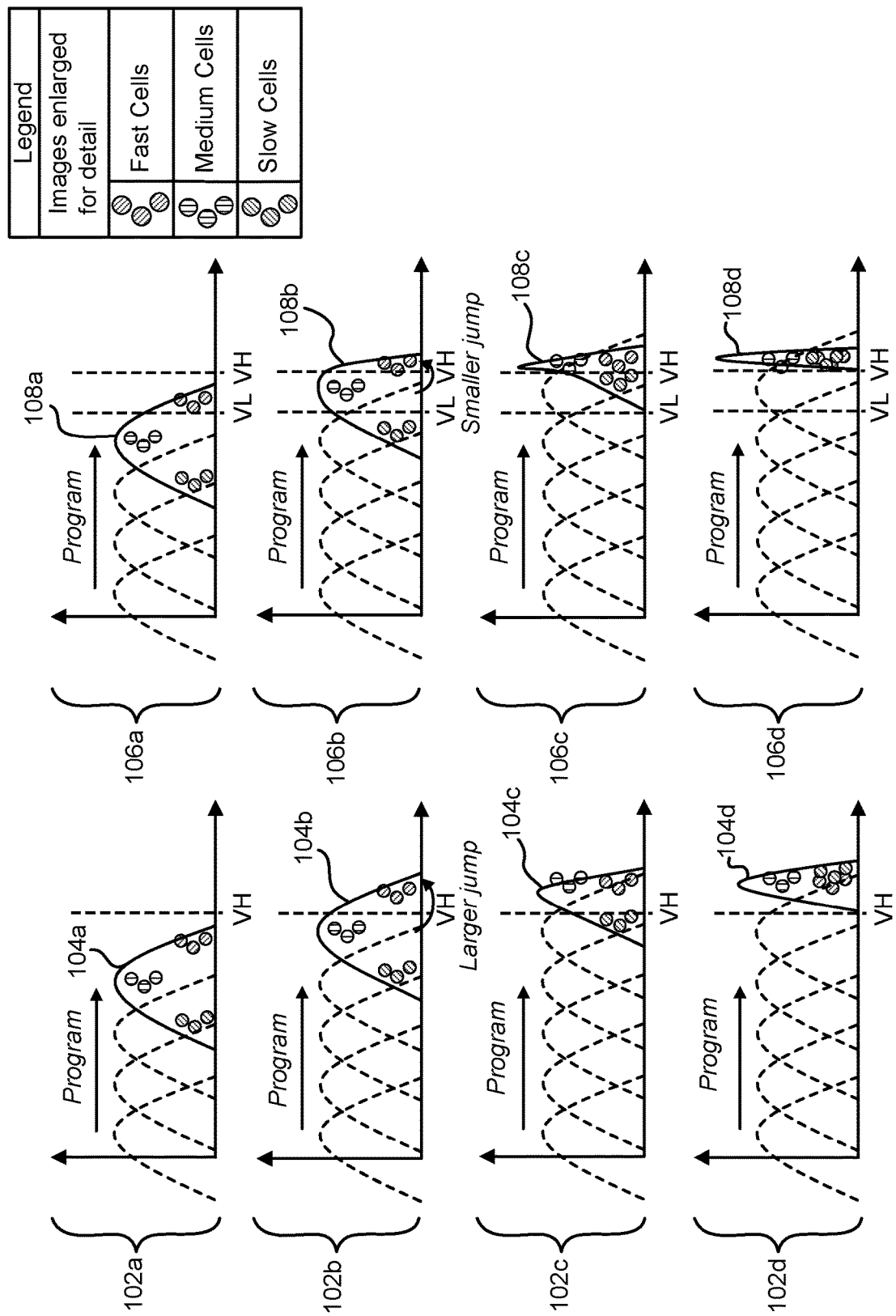
FIG. 1A illustrates an example of programming memory cells using one verify level.
FIG. 1B illustrates an example of programming memory cells using two verify levels.

FIG. 1A illustrates an example of programming memory cells using one verify level (VH). Plots 102a-d illustrate a voltage threshold (Vth) distribution 104a-d over four programming cycles. Each of the plots 102a-d is illustrated with Vth on the horizontal axis and a number of memory cells on the vertical axis. The range of voltage threshold distributions 104a-d is caused by differences in memory cell programming speed. For example, some memory cells tend to program more slowly than others. Accordingly, "slow" memory cells, "medium" memory cells, and "fast" memory cells are illustrated.

As illustrated in FIG. 1A, a first plot 102a illustrates a threshold distribution 104a after a number of programming steps. In the second plot 102b, the threshold distribution 104b crosses a verify level (VH) with a relatively large jump. In the third plot 102c, another programming step is applied and the threshold distribution 104c begins to narrow as programming is slowed. The fourth plot 102d illustrates a final threshold distribution 104d after another programming step.

During program operations, there is a tradeoff between reducing programming time and achieving narrow threshold voltage (Vth) distributions for the different data states. Programming speed can be increased by using a larger program pulse step size. However, this can result in large overshoots past the verify level, causing a wide Vth distribution. For example, the second plot 102b illustrates how the threshold distribution 104b has a larger jump over the verify level (VH) due to a large program step size. Accordingly, the final threshold voltage distribution 104d exhibits a relatively wide distribution. On the other hand, if a smaller program pulse step size is used, a narrow Vth distribution is achieved at the cost of increased programming time.

FIG. 1B illustrates an example of programming memory cells using two verify levels (VL and VH). Plots 106a-d illustrate a voltage threshold (Vth) distribution 108a-d over four programming cycles. Each of the plots 106a-d is illustrated with Vth on the horizontal axis and a number of memory cells on the vertical axis. "Slow" memory cells, "medium" memory cells, and "fast" memory cells are illustrated.

As illustrated in FIG. 1B, a first plot 106a illustrates a threshold distribution 108a after a number of programming steps. In the first plot 106a, the threshold distribution 108a crosses a lower verify level (VL). In the second plot 106b, programming is slowed, resulting in a smaller jump over a higher verify level (VH). In the second plot 106b, the threshold distribution 108b narrows as programming is slowed. Proceeding to the third plot 106c, another programming step is applied and the threshold distribution 108c approaches a target data state slowly, causing further narrowing of the threshold distribution 108c. After another programming step is applied to the threshold distribution 108c in the third plot 106c, the fourth plot 106d illustrates a final threshold distribution 108d.

As illustrated in FIG. 1B, another approach is to verify the storage elements at two separate verify levels (VL and VH) for each target data state. Before the threshold voltage of a storage element reaches a lower verify level (VL) of its target data state, its bit line voltage (Vbl) is set to a low level such as 0 volts (V) to cause the storage element to have a relatively fast programming speed. When the threshold voltage 108a of the storage element exceeds the lower verify level, its Vbl is set to an intermediate level to cause the storage element to have a relatively slow programming speed, allowing for a smaller jump above a higher verify level (VH). When the threshold voltage 108b of the storage element exceeds the higher verify level (VH) of its target data state, its Vbl is set to a high level to inhibit (lockout) programming of the storage element. As illustrated in FIG. 1B, this approach can result in a final threshold voltage 108d with a tighter distribution.

While the approach illustrated in FIG. 1B enables improved programming accuracy, the approach comes with a higher overhead cost since multiple verify levels are utilized. Another issue that occurs with some approaches is that although the bit line voltage is increased to slow down programming speed as the voltage distribution approaches the target voltage distribution, programming tends to speed up again due to the increasing programming voltages. For example, a fixed bit line (BL) voltage is applied to cells during programming. The cells temporarily enter a non-steady state such that programming is slowed down. However, as programming continues, the cells eventually return to another steady state with fast programming, which can cause an undesirable (e.g., wider) voltage distribution.

Techniques for bit line voltage control for damping memory programming are disclosed herein. In an embodiment, a BL voltage is stepped up during a program pulse period (PD1) to slow down memory cells when they approach a target threshold voltage. A "program pulse" is an increased (e.g., stepped up) voltage signal or pulse applied to a word line to program a storage element. As used herein, the term "storage element" refers, for example, to a memory cell, electrical circuitry or any other component capable of storing one or more bits of information. A "target threshold voltage" is a specified or desired threshold voltage of a storage element to represent a corresponding data state. In an embodiment, the stepped-up BL voltage is applied at different timing points (tx) over a series of program pulses, and/or the period of the stepped-up BL voltage varies over the series of program pulses. For example, during a first program pulse, the stepped-up BL voltage is delivered at tx=−1 microsecond (μs) before the end of the program pulse. During a second program pulse, the stepped-up BL voltage is delivered at tx=−2 μs before the end of the program pulse. During a third program pulse, the stepped-up BL voltage is delivered at tx=−3 μs before the end of the program pulse. Accordingly, memory cell programming is consistently slowed down (without returning to faster steady state programming before programming is finished, for example). In an embodiment, a better threshold voltage margin (e.g., a tighter Vt distribution) is obtained with less overhead (e.g., fewer verify levels), allowing higher state programming speed while avoiding performance loss.

Figure 2:
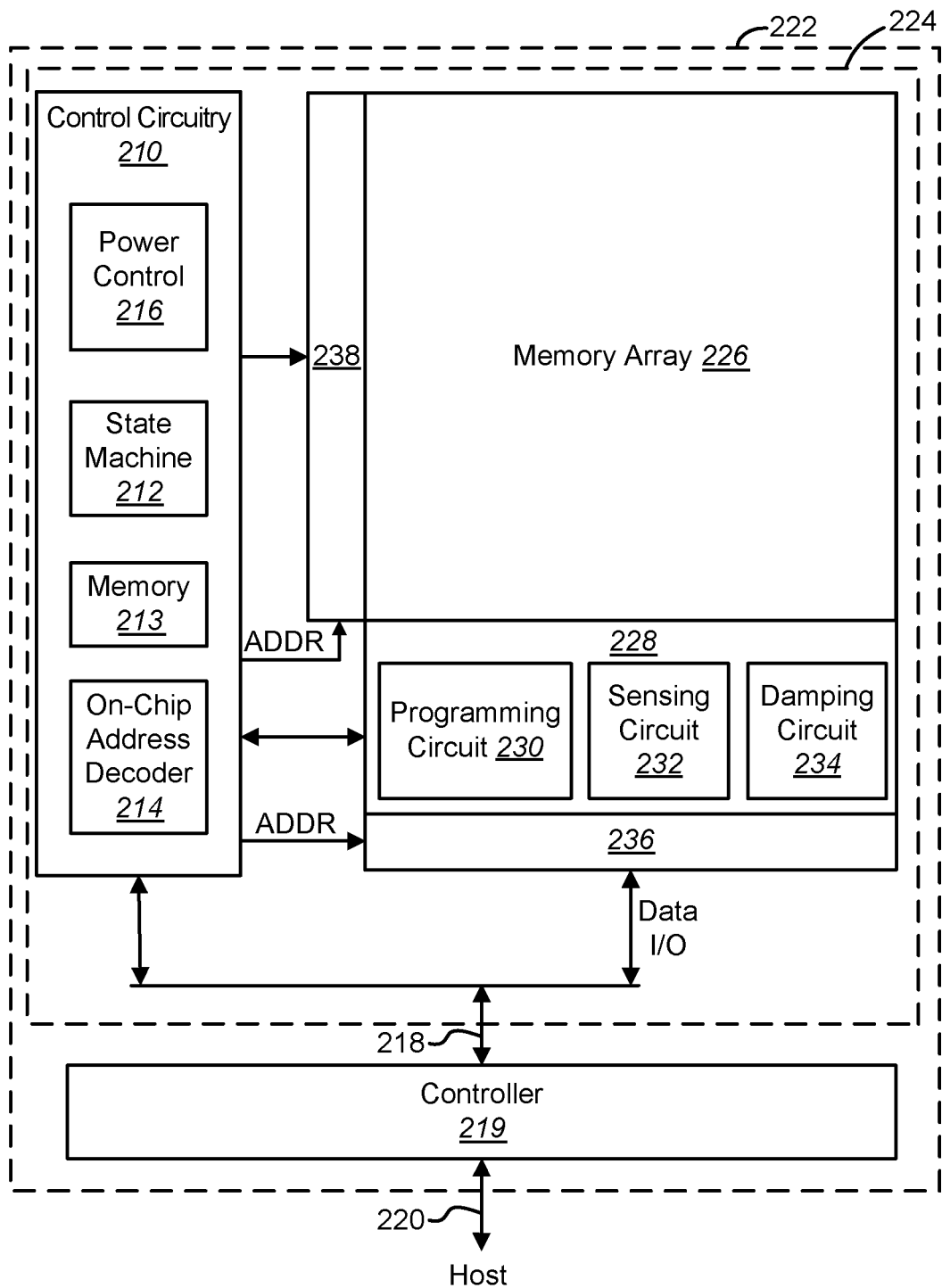
FIG. 2 is a block diagram of a non-volatile memory system using single row/column decoders and read/write circuits.

FIG. 2 is a block diagram of a non-volatile memory system using single row/column decoders and read/write circuits. The diagram illustrates a memory device 222 having read/write circuits for reading and programming a page of storage elements, according to one embodiment. Memory device 222 may include one or more memory die 224. Memory die 224 includes a two-dimensional memory array 226 of storage elements, control circuitry 210, and read/write circuits 228.

In some embodiments, the array 226 of storage elements can be three dimensional. The memory array 226 is addressable by word lines via a row decoder 238 and by bit lines via a column decoder 236. The read/write circuits 228 include a programming circuit 230, a sensing circuit 232 (e.g., multiple sense blocks), and a damping circuit 234. The read/write circuits 228 allow a page of storage elements to be read or programmed in parallel.

In an embodiment, the programming circuit 230 is configured to generate and send (or supply) program pulses to the memory array 226. For example, the programming circuit 230 sends a series of program pulses to a selected word line coupled to storage elements (e.g., memory cells) of the memory array 226. The program pulses increase in amplitude (e.g., increase in voltage in a linear or non-linear manner) over a number of programming cycles to progressively (or incrementally) increase the threshold voltages of the storage elements to states corresponding to data being stored. The term "progressively" or "incrementally" means occurring in steps over time (e.g., over a number of programming cycles).

In an embodiment, the sensing circuit 232 is configured to determine threshold voltages of storage elements (e.g., memory cells). For example, the sense circuit 232 applies one or more voltages (e.g., a verify levels, verify pulses) to a selected word line of a storage element to determine whether the storage element is activated at the voltage(s), which indicates the threshold voltage of the storage element. In an embodiment, the sensing circuit 232 determines whether a threshold voltage of a storage element (e.g., memory cell) satisfies a trigger threshold voltage. The trigger threshold voltage is a voltage at which program damping is applied to slow storage element programming. For example, if the sensing circuit 232 determines that a storage element (e.g., memory cell) threshold voltage is satisfied (e.g., is greater than the trigger threshold voltage, or is greater than or equal to the trigger threshold voltage), the damping circuit 234 may apply a damping technique to slow storage element programming for one or more subsequent programming cycles. An example of a damping technique includes increasing a voltage of a bit line after initiation of and during a program pulse. Another example of damping technique includes increasing a period of a bit line pulse during successive write pulses. Another example of a damping technique includes increasing pass pulses to unselected word lines after initiation of and during at least one program pulse. In an embodiment, the sensing circuit 232 makes a trigger threshold voltage determination in response to a program pulse being sent. In an embodiment, the sensing circuit 232 sends one or more verify pulses to verify the threshold voltage of one or more storage elements until one or more threshold voltages reach one or more target threshold voltages. For example, a program pulse may alternate with one or more verify levels on a selected word line.

The damping circuit 234 is configured to increase (e.g., step up) a voltage (e.g., a bias voltage) of a bit line connected to a storage element (e.g., memory cell) after initiation of and during one or more program pulses. Initiation of a program pulse is a time when the beginning of a program pulse is sent or delivered to a storage element (e.g., memory cell). In an embodiment, initiation of a program pulse occurs when a transition to a program pulse voltage (e.g., VP) begins. In an embodiment, initiation of a program pulse occurs when an increase above a baseline voltage, a step voltage, or another voltage (e.g., 0 V, 10 V, or another voltage) begins. "During a program pulse" refers to a period of time in which a program pulse is elevated to a particular level (e.g., greater than 0 V, at a specified voltage (VP) of a program pulse, and/or at a peak voltage). For example, the damping circuit 234 increases a voltage of a bit line connected to a storage element that is being programmed during one or more program pulses. A more specific example of increasing the voltage of the bit line after initiation of and during a program pulse is given in connection with FIG. 5. In an embodiment, increasing the voltage (e.g., bias voltage) of the bit line is performed in response to the threshold voltage of the storage element (e.g., memory cell) satisfying the trigger threshold voltage. Increasing the voltage on the bit line of the storage element slows the programming speed of the storage element, thereby resulting in tighter threshold voltage distributions and/or helping to avoid over-programming the storage element. It should be noted that the operations of the programming circuit 230, the sensing circuit 232, and/or the damping circuit 234 may be performed for one or more storage elements in parallel (e.g., coincidentally). In an embodiment, the damping circuit 234 is configured to send a damping pulse coincident with a program pulse (without increasing the damping pulse after initiation of and during the corresponding program pulse) and then increase or step up the damping pulse after initiation of and during a subsequent program pulse.

In an example, the programming circuit 230 sends a first program pulse to a storage element. The sensing circuit 232 determines that the threshold voltage of the storage element satisfies the trigger threshold voltage in response to the first program pulse. The programming circuit 230 sends a second program pulse to the storage element and the damping circuit 234 increases the voltage on the bit line of the storage element after the initiation of the second program pulse. In an embodiment, the damping circuit 234 increases the period of the voltage increase (e.g., damping pulse) on the bit line for one or more subsequent program pulses. For example, the programming circuit 230 sends a third program pulse to the storage element (e.g., memory cell) after the second program pulse. The damping circuit 234 is configured to increase the voltage of the bit line of the storage element after initiation of and during the third program pulse for a greater period than the voltage increase of the bit line during the second program pulse. A more specific example of progressively (e.g., incrementally) increasing the period of the bit line voltage increases (e.g., damping pulses) is given in connection with FIG. 6. In an embodiment, progressively (e.g., incrementally) increasing the period of the bit line voltage (or damping pulse) includes increasing the period of the bit line voltage (or damping pulse) at each programming cycle until programming is complete. In an embodiment, progressively (e.g., incrementally) increasing the period of the bit line voltage (or damping pulse) includes increasing the period of the bit line voltage (or damping pulse) at one or more (but not all) programming cycles until programming is complete. In an embodiment, the amplitude or voltage of the bit line voltage increases (e.g., damping pulses, stepped-up portion of a damping pulse) may be increased (e.g., progressively, incrementally, and/or over a number of program cycles).

In an embodiment, the read/write circuitry 228 includes a pass circuit (not shown) in FIG. 2. The pass circuit is configured to deliver one or more pass pulses to unselected word lines of the memory array 226. In an embodiment, the pass circuit is configured to increase a voltage of unselected word lines after the initiation of and during one or more program pulses. A more specific example of increasing the voltage of unselected word lines after initiation of and during program pulses is given in connection with FIG. 8.

In an embodiment, the damping circuit 234 is configured to increase the voltage of the bit line after at least 25% of a period for the program pulse passes (e.g., 25% of the period of the entire program pulse or 25% of the period of a peak of a program pulse). In an embodiment, the damping circuit 234 is configured to increase the voltage of the bit line after at least 50% of a period for the program pulse passes (e.g., 50% of the period of the entire program pulse or 50% of the period of a peak of a program pulse). Other timing during a program pulse may be utilized. In an embodiment, the damping circuit 234 is configured to stop increasing the voltage of the bit line (e.g., stop or end a damping pulse) simultaneous with termination of the program pulse. A "termination" of a program pulse occurs when the program pulse begins to decline or when a word line pulse returns to a baseline (e.g., 0 V) after a program pulse. In another embodiment, the damping circuit 234 is configured to stop increasing the voltage of the bit line (e.g., stop or end a damping pulse) before termination of the program pulse.

As used herein, the term "simultaneous" means at substantially the same time. In the context of pulses, "substantially" may be defined as plus or minus κ% of a period of a pertinent pulse in an embodiment, or plus or minus 10% of a period of a pertinent pulse in another embodiment. As used herein, the term "coincident" means overlapping in time. As used herein, the term "concurrent" means that at least two events begin and end at substantially the same times.

Typically, a controller 219 is included in the same memory device 222 (e.g., a removable storage card) as the one or more memory die 224. Commands and data are transferred between the host and controller 219 via bus 220 and between the controller 219 and the one or more memory die 224 via lines 218.

The control circuitry 210 cooperates with the read/write circuits 228 to perform memory operations on the memory array 226, and includes a state machine 212, an on-chip address decoder 214, and a power control module 216. The state machine 212 provides chip-level control of memory operations. The on-chip address decoder 214 provides an address interface between that used by the host or a memory controller to the hardware address used by the decoders 236 and 238. The power control module 216 controls the power and voltages supplied to the word lines and bit lines during memory operations. A memory 213 can store original write data, modified write data, and status bits for use by the state machine 212.

In some implementations, some of the components of FIG. 2 can be combined. In various designs, one or more of the components (alone or in combination), other than memory array 226, can be thought of as a managing or control circuit. For example, one or more control circuits may include any one of, or a combination of, control circuitry 210, state machine 212, decoders 214/236/238, power control module 216, sense blocks 232, read/write circuits 228, programming circuit 230, sensing circuit 232, damping circuit 234, and/or controller 219, and so forth.

In another embodiment, a non-volatile memory system uses dual row/column decoders and read/write circuits. The various peripheral circuits access opposite sides of the memory array 226 so that the densities of access lines and circuitry on each side are reduced by half. Thus, the row decoder is split into two row decoders and the column decoder into two column decoders. Similarly, the read/write circuits are split into read/write circuits connecting to bit lines from the bottom and read/write circuits connecting to bit lines from the top of the array 226. In this way, the density of the read/write modules is essentially reduced by one half.

Figure 3:
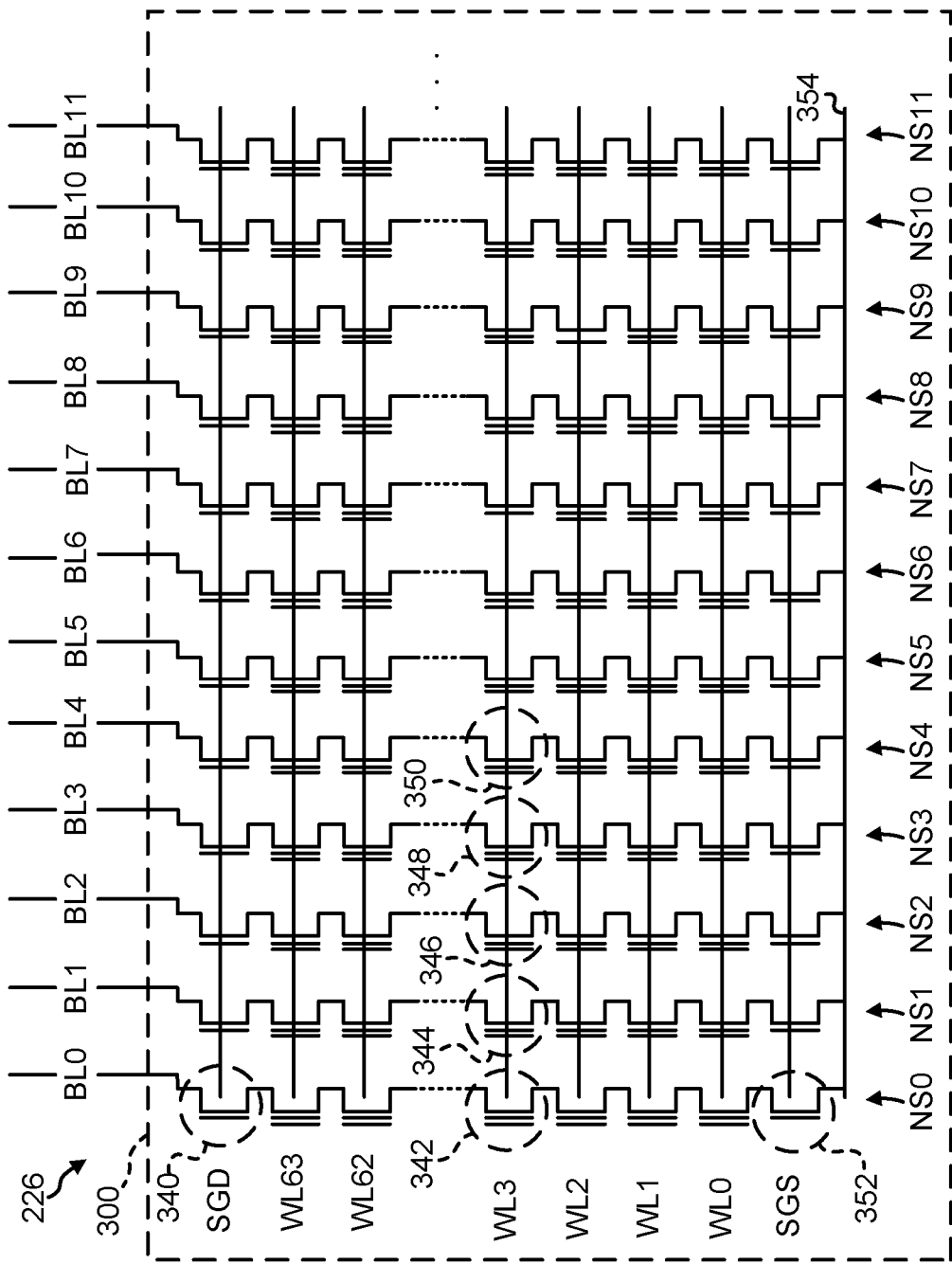
FIG. 3 depicts a block of NAND flash memory cells in the memory array of FIG. 2.

FIG. 3 depicts a block of NAND flash memory cells in the memory array 226 of FIG. 2. The memory array 226 can include many blocks. An illustrative block 300 includes a number of NAND strings NS0 to NS11 and respective bit lines, e.g., BL0 to BL11, which are shared among the blocks. Each NAND string is connected at one end to a drain select gate (SGD), and the control gates of the drain select gates are connected via a common SGD line. Each NAND string is connected at its other end to a source select gate which, in turn, is connected to a common source line 354. For example, NS0 includes a source side select gate transistor 352 and a drain side select gate transistor 340. Example storage elements 342, 344, 346, 348, and 350 are in NS0 to NS4, respectively, and are connected to a word line WL3. For example, WL3 could be a selected word line which is selected for programming and the example storage elements can be selected storage elements which are selected for programming. Other storage elements connected to WL3 can also be selected storage elements. Sixty-four word lines, for example, WL0-WL63, extend between the source-side select gates and the drain-side select gates.

The sensing circuitry 232 includes multiple sense blocks. In one approach, one sense block is provided for a group of NAND strings, such as four NAND strings. For example, a sense block SB0 is associated with BL0-BL3. Another sense block SB1 is associated with BL4-BL7, and yet another sense block SB2 is associated with BL8-BL11. Each sense block includes a memory controller, e.g., MC0, MC1, and MC2 in SB0, SB1, and SB2, respectively. Each sense block also includes a sense module for each NAND string. For example, sense modules SM0, SM1, and SM2 may be included in SB0, SB1, and SB2, respectively.

Other types of non-volatile memory in addition to NAND flash memory can also be used. For example, another type of memory cell useful in flash EEPROM systems utilizes a nonconductive dielectric material in place of a conductive floating gate to store charge in a non-volatile manner. A triple layer dielectric formed of silicon oxide, silicon nitride, and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the Vth of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor. Another type of memory uses a metallic (conductive) charge storage element in a NAND architecture.

In another approach. NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. Other types of non-volatile memory are also known.

Figure 4:
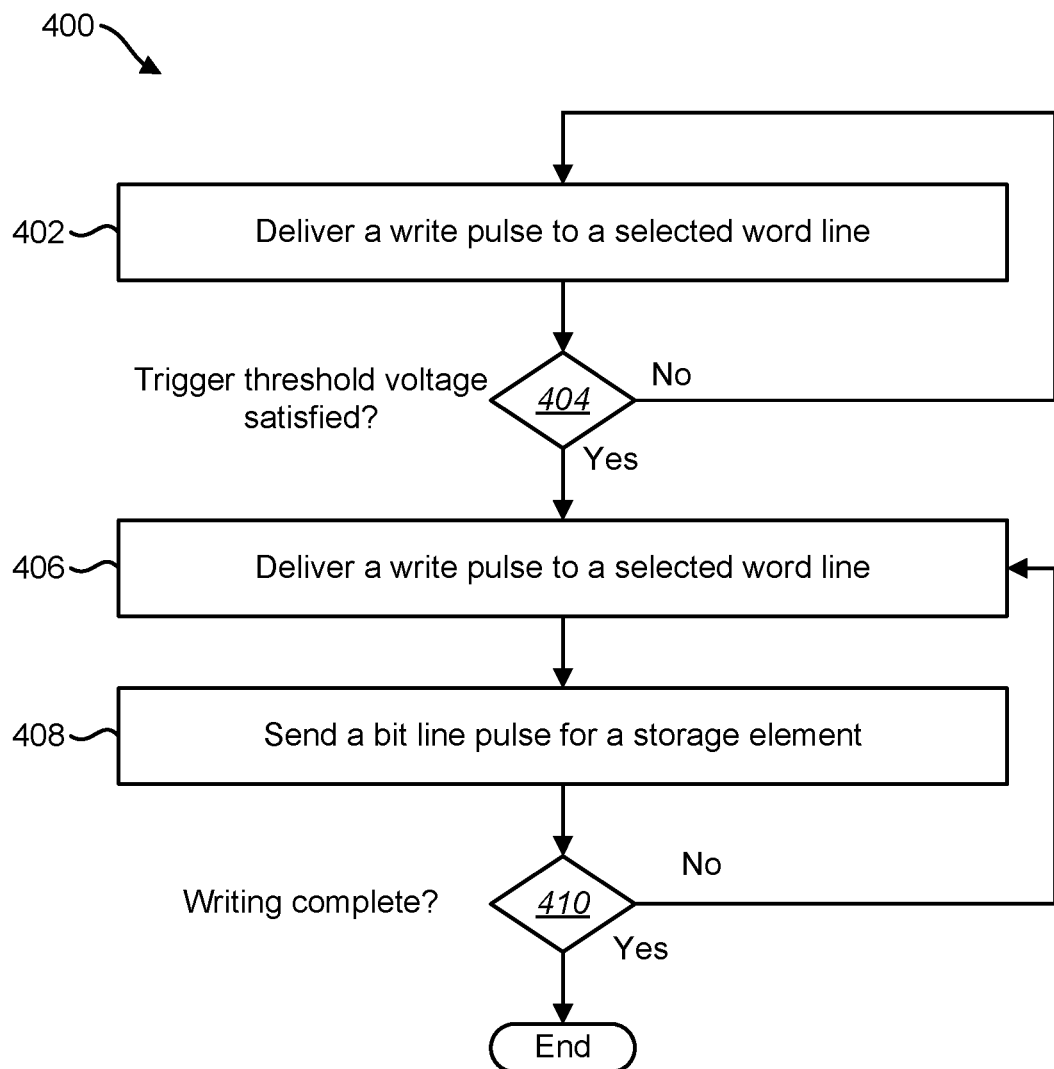
FIG. 4 is a flow diagram illustrating an example of a method of damping memory programming.

FIG. 4 is a flow diagram illustrating an example of a method 400 of damping memory programming. In one embodiment, a memory die 224 performs the method 400. For example, the method 400 is performed by a read/write circuits 228 of the memory die 224 of FIG. 2.

The memory die 224 (e.g., a write circuit 228 or programming circuit 230) delivers 402 a write pulse to a selected word line. This is accomplished as described in connection with FIG. 2. A "write pulse" is a voltage pulse (e.g., program pulse) applied to a word line to write or program data to one or more storage elements (e.g., memory cells). For example, the memory die 224 (e.g., write circuit 228 or programming circuit 230) applies a voltage to a selected word line (e.g., to control gates of memory cells connected to the selected word line). The memory die 224 may deliver multiple write pulses to incrementally program a storage element connected to the selected word line to a target voltage. The "target voltage" is a threshold voltage corresponding to a data state representing data being written (e.g., programmed) by the write circuit. In an embodiment, a trigger threshold voltage is offset from the target voltage (e.g., is offset below the target voltage by an amount of voltage).

The memory die 224 determines 404 whether a trigger threshold voltage is satisfied. This is accomplished as described in connection with FIG. 2. For example, the memory die 224 (e.g., write circuit 228 or sensing circuit 232) delivers a verify pulse to the selected word line and determines whether a threshold voltage of one or more storage elements (e.g., memory cells) is greater than the trigger threshold voltage. In a case that the trigger threshold voltage is not satisfied, the memory die 224 delivers 402 another write pulse. As can be observed, the memory die 224 (e.g., write circuit 228) may deliver write pulses alternating with verify pulses to a selected word line to incrementally program a storage element (e.g., memory cell) to a target voltage.

In a case that the trigger threshold voltage is satisfied, the memory die 224 (e.g., write circuit 228 or programming circuit 230) delivers 406 a write pulse to the selected word line. This is accomplished as described in connection with FIG. 2.

The memory die 224 (e.g., write circuit 228, damping circuit 234) sends 408 a bit line pulse (e.g., damping pulse) for a storage element (e.g., memory cell) after a voltage (e.g., threshold voltage) of the storage element satisfies the trigger threshold voltage. This is accomplished as described in connection with FIG. 2. A "bit line pulse" is voltage applied to a bit line for a period of time. For example, the bit line pulse starts after initiation of and during the corresponding (e.g., delivered 406) program pulse.

The memory die 224 determines 410 whether writing is complete. In an embodiment, the memory die 224 counts a number of programming pulses provided to the storage element (e.g., memory cell). If the number reaches a threshold, the memory die 224 determines that writing is complete for that storage element and the method 400 ends. In another embodiment, the memory die 224 performs a verify operation (e.g., sensing the storage element) to determine whether the storage element is at a target voltage. For example, if the verify operation indicates that the storage element is at the target voltage, then writing is complete and the method 400 ends.

In a case that writing is not complete, the memory die 224 returns to deliver 406 a write pulse and to send 408 a bit line pulse after initiation of and during the write pulse. In an embodiment, a period of each bit line pulse increases as the voltage of the storage element (e.g., memory cell) approaches the target voltage.

In an embodiment, the method 400 further includes stepping up, by the memory die 224 (e.g., write circuit 228) at least one pass pulse to unselected word lines after initiation of and during a coincident write pulse. The memory die 224 may step up the pass pulse(s) during one or more write pulses after the trigger threshold voltage is satisfied.

Figure 5:
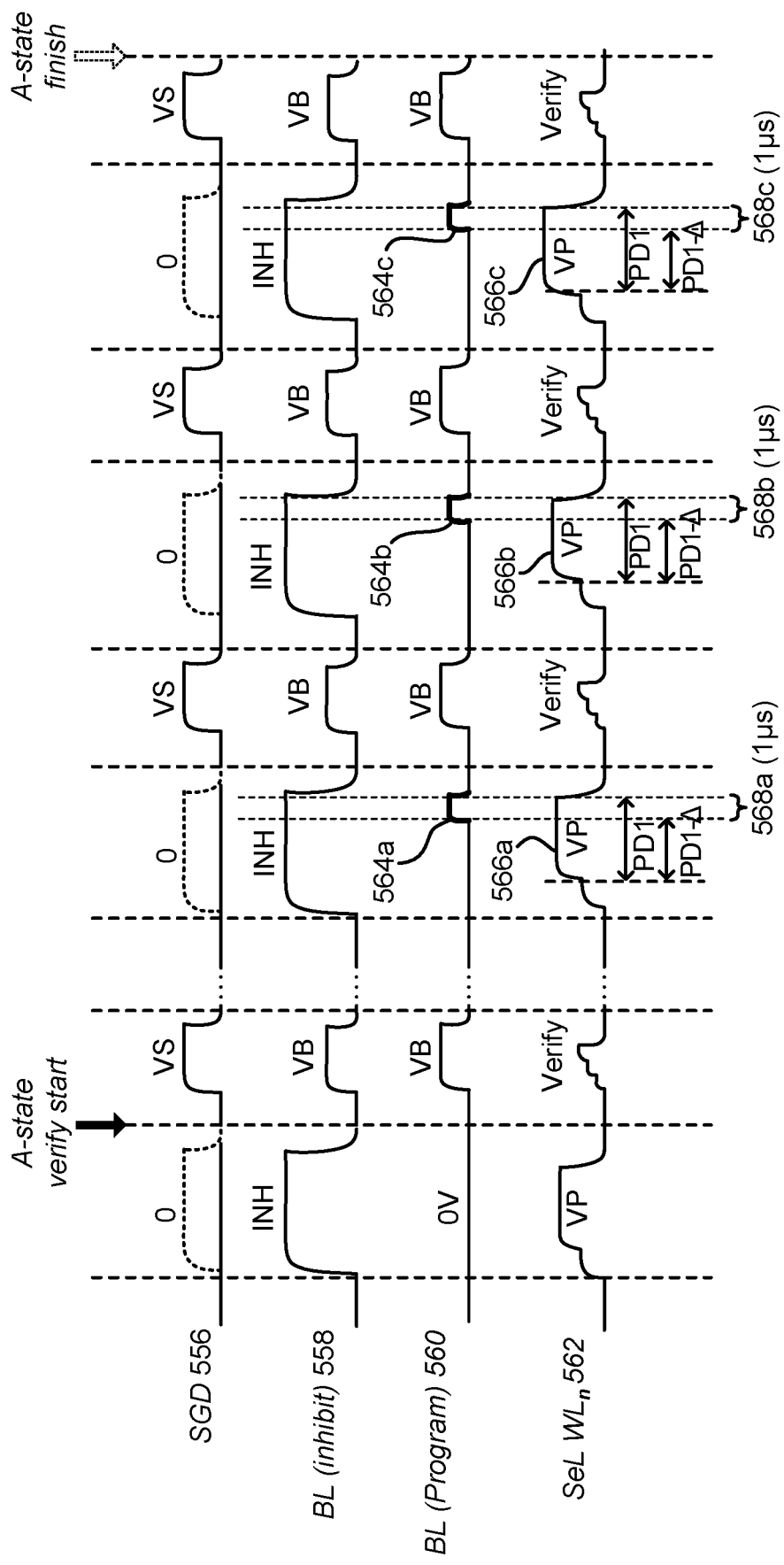
FIG. 5 is a timing diagram illustrating an example of increasing a bit line voltage during program pulses.

FIG. 5 is a timing diagram illustrating an example of increasing a bit line voltage during program pulses. The timing diagram includes a drain select gate (SGD) voltage 556, an inhibit bit line (BL) voltage 558, a program bit line (BL) voltage 560, and a selected word line (SeL $WL_n$) voltage 562. For convenience, SGD voltage pulses may have an amplitude or voltage referred to as "VS" or "VSG," BL voltage pulses may have an amplitude or voltage referred to as "VB" or "VBLC," program pulses may have an amplitude or voltage referred to as "VP" or "VPGM," and verify pulses may be referred to as "Verify." The verify pulses may be at one or more different levels to verify different states. In an embodiment, the programming circuit 230 delivers program pulses (VP) to the selected word line, the sensing circuit 232 delivers verify pulses (Verify) to the selected word line, and the damping circuit 234 delivers damping pulses to the bit line(s) being programmed. For one or more storage elements (e.g., memory cells) that are not being programmed, the inhibit bit line voltage 558 inhibits programming during inhibit (INH) pulses. For one or more storage elements (e.g., memory cells) being programmed, the program bit line voltage 560 is held low (0 V) to allow a charge to accumulate on the floating gate during a program pulse (VP) on a selected word line. In this example, a storage element (e.g., memory cell) is being programmed to a particular state (referred to as "A-state"). In an embodiment, pulse timing is based on a clock. For example, each pulse has a duration of one or more clock cycles (and/or a portion of a clock cycle).

As illustrated in FIG. 5, a program bit line voltage 560 is held low (0 V) and an inhibit bit line voltage 558 is raised while the selected word line voltage 562 includes a program pulse (VP). In an embodiment, a number of program pulses (VP) may be delivered on a selected word line before verify pulses (Verify) are delivered to the selected word line. Bit line pulses (VB) are delivered in the inhibit bit line voltage 558 and the program bit line voltage 560 coincident with the verify pulses.

When voltages of storage elements (e.g., memory cells) are distant from corresponding target voltages (e.g., before a trigger threshold voltage is satisfied), the program bit line voltage 560 is 0 V (coincident with program pulses of the selected word line voltage 562). When storage elements (e.g., memory cells) are close to the corresponding target voltages (e.g., when a trigger threshold voltage is satisfied), the program bit line voltage 560 (e.g., BL bias) will step up after initiation of and during corresponding program pulses (VP). For example, the damping circuit 234 steps up the program bit line voltage 560 to approximately VB, 0.5 V, or another voltage (e.g., the damping pulses have amplitudes of approximately 0.5 V). An amount of time "PD1" is a period of a program pulse or of a portion of a pulse (e.g., ramp up and pulse peak). In an embodiment, each program pulse 566*a*-*c* is initiated each time the selected word line voltage 562 voltage increases from a baseline voltage, a step voltage, or another voltage (e.g., 0 V, 10 V, or another voltage) for programming (e.g., and not for verification). For example, each program pulse 566*a*-*c* begins after a step and later increases to a pulse peak (VP). In one example, the selected word line steps up to ~10 V from a baseline voltage (0V) first, then to a peak or final programming voltage (e.g., 16 V~21 V). In another embodiment, a step may not occur before the program pulse is initiated. As illustrated in FIG. 5, the program pulse peak increases over a series of programming cycles in an embodiment. In the example of FIG. 5, PD1 corresponds to a period of (or duration of) a program pulse peak for each program pulse 566*a*-*c*.

In an embodiment, a period of a voltage increase (e.g., step-up or damping pulse) is referred to as A. As illustrated in FIG. 5, each damping pulse 564*a*-*c* starts after initiation of and during a corresponding program pulse 566*a*-*c*. In the example of FIG. 5, a first damping pulse 564*a* corresponds to a first program pulse 566*a*, has a first period 568*a*, and/or begins at PD1-Δ (e.g., PD1—1 μs) for a first cycle. A second damping pulse 564*b* corresponds to a second program pulse 566*b*, has a second period 568*b*, and/or begins at PD1-Δ (e.g., PD1—1 μs) for a second cycle. A third damping pulse 564*c* corresponds to a third program pulse 566*c*, has a third period 568*c*, and/or begins at PD1-Δ (e.g., PD1—1 μs) for a third cycle. This procedure is repeated until the states are completely formed (e.g., until the memory cells are completely programmed). In the example of FIG. 5, the procedure repeats until the A-state programming is finished.

In this example, the periods 568*a*-*c* of the damping pulses 564*a*-*c* are the same duration. Each damping pulse 564*a*-*c* begins after initiation of and during corresponding program pulses 566*a*-*c*. Each damping pulse 564*a*-*c* reduces corresponding effective program pulse length (to PD1-Δ). Accordingly, the programming speed of the storage elements (e.g., memory cells) is slowed. In an embodiment, the damping circuit 234 determines damping pulse timing based on termination timing of a corresponding program pulse. For example, the start time of a first damping pulse 564a is determined as the termination time of the corresponding program pulse 566a minus Δ. In an embodiment, the damping circuit 234 determines damping pulse timing based on start timing of a corresponding program pulse. For example, the start time of a first damping pulse 564a is determined as the start time of the corresponding program pulse 566a plus an amount of time (e.g., a percentage of the period or duration of the program pulse 566a). In an embodiment, the damping circuit 234 determines damping pulse timing based on a common clock between program bit line voltage 560 and the selected word line voltage 562. For example, the start time of a first damping pulse 564a is determined as a number of clock cycles (and/or a portion of a clock cycle) after the start time of the corresponding program pulse 566a.

Figure 6:
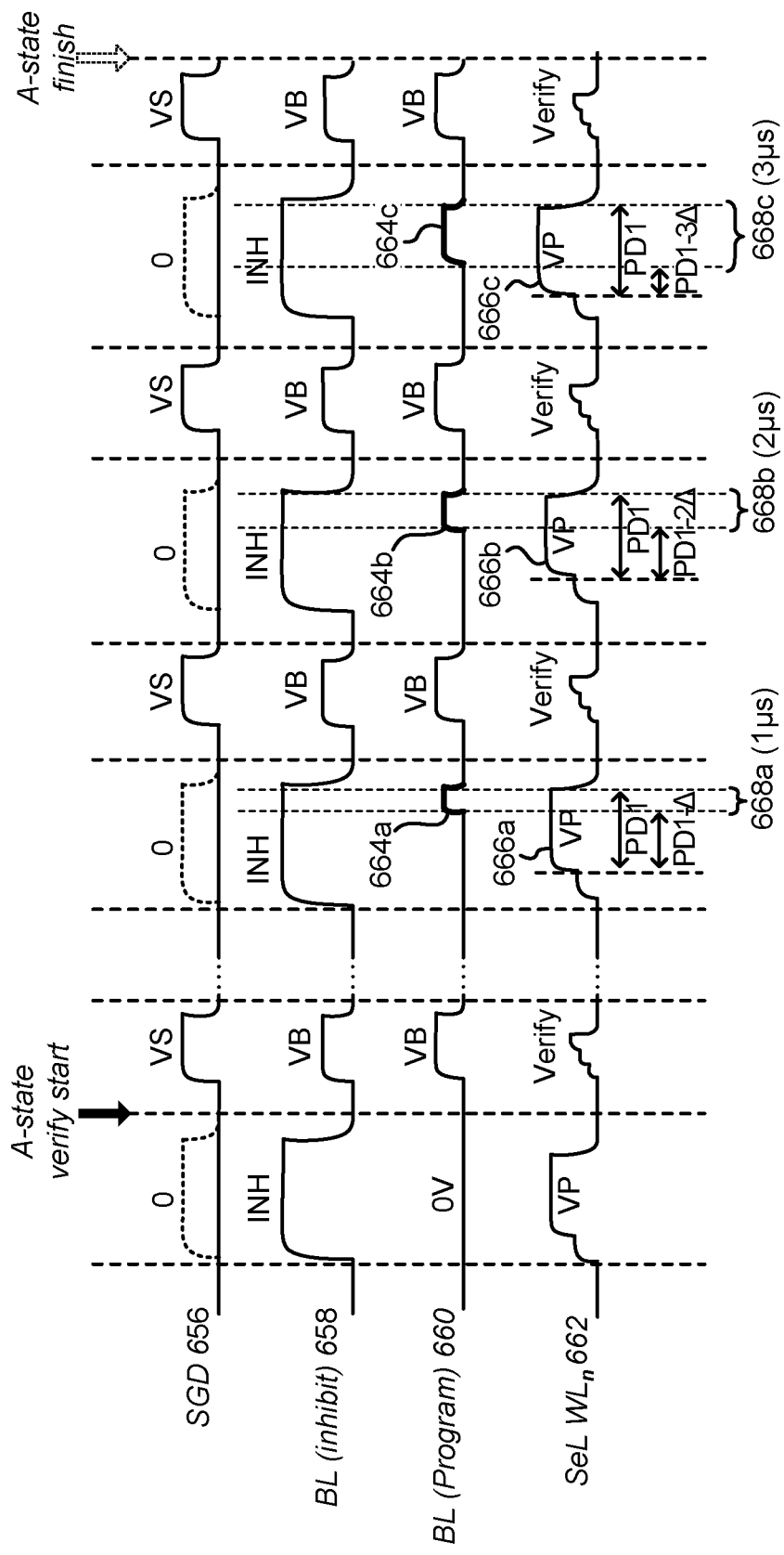
FIG. 6 is a timing diagram illustrating another example of increasing a bit line voltage during program pulses.

FIG. 6 is a timing diagram illustrating another example of increasing a bit line voltage during program pulses. The timing diagram includes a drain select gate (SGD) voltage 656, an inhibit bit line (BL) voltage 658, a program bit line (BL) voltage 660, and a selected word line (SeL $WL_n$) voltage 662 over time. In an embodiment, the programming circuit 230 delivers program pulses (VP) to the selected word line, the sensing circuit 232 delivers verify pulses (Verify) to the selected word line, and the damping circuit 234 delivers damping pulses to the bit line(s) being programmed. The verify pulses may be at one or more different levels to verify different states. For one or more storage elements (e.g., memory cells) that are not being programmed, the inhibit bit line voltage 658 inhibits programming during inhibit (INH) pulses. For one or more storage elements (e.g., memory cells) being programmed, the program bit line voltage 660 is held low (0 V) to allow a charge to accumulate on the floating gate during a program pulse (VP) on a selected word line. In this example, a storage element (e.g., memory cell) is being programmed to a particular state (referred to as "A-state").

As illustrated in FIG. 6, a program bit line voltage 660 is held low (0 V) and an inhibit bit line voltage 658 is raised while the selected word line voltage 662 includes a program pulse (VP). In an embodiment, a number of program pulses (VP) may be delivered on a selected word line before verify pulses (Verify) are delivered to the selected word line. Bit line pulses (VB) are delivered in the inhibit bit line voltage 658 and the program bit line voltage 660 coincident with the verify pulses.

When voltages of storage elements (e.g., memory cells) are distant from corresponding target voltages (e.g., before a trigger threshold voltage is satisfied), the program bit line voltage 660 is 0 V (coincident with program pulses of the selected word line voltage 662). When storage elements (e.g., memory cells) are close to the corresponding target voltages (e.g., when a trigger threshold voltage is satisfied), the program bit line voltage 660 (e.g., BL bias) will step up after initiation of and during corresponding program pulses (VP). For example, the damping circuit 234 steps up the program bit line voltage 660 to approximately VB, 0.5 V, or another voltage (e.g., the damping pulses have amplitudes of approximately 0.5 V). In an embodiment, each program pulse 666a-c is initiated each time the selected word line voltage 662 increases from a baseline voltage, a step voltage, or another voltage (e.g., 0 V, 10 V, or another voltage) for programming (e.g., and not for verification). For example, each program pulse 666a-c begins with a step and later increases to a program pulse peak. As illustrated in FIG. 6, the program pulse peak increases over a series of programming cycles in an embodiment. In the example of FIG. 6, PD1 corresponds to a period of (or duration of) a program pulse peak for each program pulse 666a-c.

In an embodiment, the damping circuit 234 is configured to (after a voltage of the memory cell satisfies the trigger threshold voltage) progressively increase a period A of damping pulses on the bit line being programmed after initiation of and during each of the respective program pulses. As illustrated in FIG. 6, each damping pulse 664a-c starts after initiation of and during a corresponding program pulse 666a-c. In the example of FIG. 6, a first damping pulse 664a corresponds to a first program pulse 666a, has a first period 668a, and/or begins at PD1-Δ (e.g., PD1—1 μs) for a first cycle. A second damping pulse 664b corresponds to a second program pulse 666b, has a second period 668b, and/or begins at PD1-2Δ (e.g., PD1—2 μs) for a second cycle. A third damping pulse 664c corresponds to a third program pulse 666c, has a third period 668c, and/or begins at PD1-3Δ (e.g., PD1—3 μs) for a third cycle. This procedure is repeated until the states are completely formed (e.g., until the memory cells are completely programmed). In the example of FIG. 6, the procedure repeats until the A-state programming is finished.

In this example, the periods 668a-c of the damping pulses 664a-c increase in duration over programming cycles. In an embodiment, the increase in duration may uniform (e.g., +1 μs per programming cycle). Each damping pulse 664a-c begins after initiation of and during corresponding program pulses 666a-c. Each damping pulse 664a-c progressively reduces corresponding effective program pulse length (to PD1-Δ, then PD1-2Δ, and then PD1-3Δ). Accordingly, the programming speed of the storage elements (e.g., memory cells) is increasingly slowed. In an embodiment, the damping circuit 234 determines damping pulse timing based on termination timing of a corresponding program pulse. For example, the start time of a first damping pulse 664a is determined as the termination time of the corresponding program pulse 666a minus Δ, 2Δ, 3Δ, etc. In an embodiment, the damping circuit 234 determines damping pulse timing based on start timing of a corresponding program pulse. For example, the start time of a first damping pulse 664a is determined as the start time of the corresponding program pulse 666a plus an amount of time (e.g., a percentage of the period or duration of the program pulse 666a). In an embodiment, the damping circuit 234 determines damping pulse timing based on a common clock between program bit line voltage 660 and the selected word line voltage 662. For example, the start time of a first damping pulse 664a is determined as a number of clock cycles (and/or a portion of a clock cycle) after the start time of the corresponding program pulse 666a. As illustrated in FIG. 6, the periods of the damping pulses 664a-c linearly increase (e.g., increase the same amount per programming cycle). In an alternative embodiment (not illustrated), the periods of the damping pulses 664a-c non-linearly increase.

Figure 7:
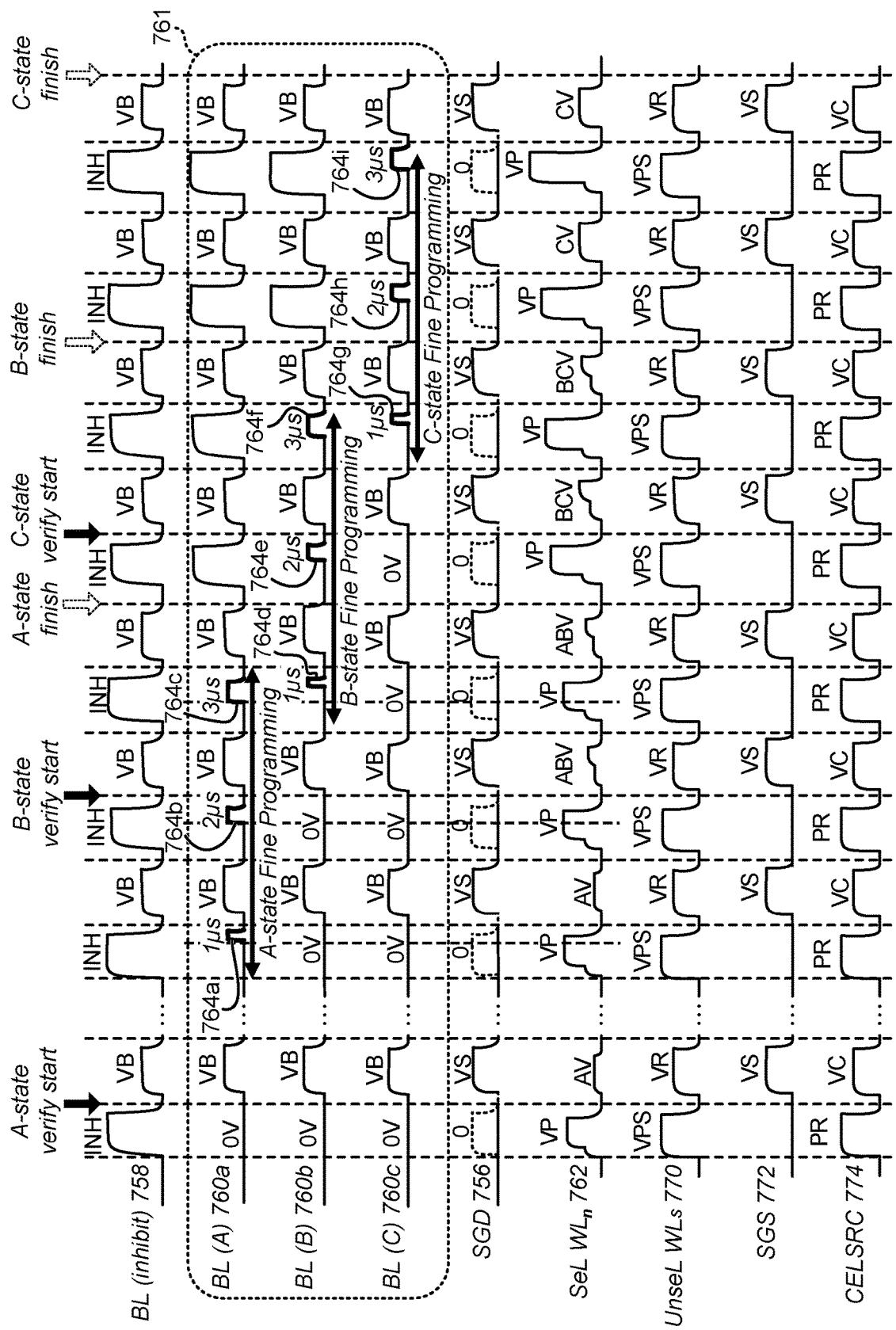
FIG. 7 is a timing diagram illustrating an example of increasing a bit line voltage during program pulses for multiple states.

FIG. 7 is a timing diagram illustrating an example of increasing a bit line voltage during program pulses for multiple states. The timing diagram includes a drain select gate (SGD) voltage 756, an inhibit bit line (BL) voltage 758, an A-state program bit line (BL (A)) voltage 760a, a B-state program bit line (BL (B)) voltage 760b, a C-state program bit line (BL (C)) voltage 760c, a selected word line (SeL $WL_n$) voltage 762, unselected word line (UnseL WLs) voltages 770, a source select gate (SGS) voltage 772, and a cell source voltage (CELSRC) 774 over time. In an embodiment, the programming circuit 230 delivers program pulses (VP) to the selected word line, the sensing circuit 232 delivers verify pulses (AV, ABV, BCV, CV) to the selected word line, and the damping circuit 234 delivers damping pulses to the bit line(s) being programmed. The verify pulses may be at one or more different levels to verify different states. For example, a verify pulse AV is used to verify an A state, a verify pulse ABV is used to verify A and B states, a verify pulse BCV is used to verify B and C states, and a verify pulse CV is used to verify a C state. In an embodiment, a pass circuit delivers pass pulses (VPS or VPASS) and/or read pulses (VR or VREAD) to unselected word lines. For example, the unselected word line voltages 770 include pass pulses coincident with (e.g., concurrent with) program pulses (VP) on the selected word line, and/or include read pulses coincident with (e.g., concurrent with) verify pulses (AV, ABV, BCV, CV) on the selected word line. In an embodiment, PROGSRC (PR) and VCELSRC (VC) pulses are delivered in the CELSRC voltage 774. The CELSRC voltage 774 is a source line voltage. A source line voltage may be not biased (at 0V) or may have some voltage higher than 0 V. In the example illustrated in FIG. 7, the CELSRC voltage 774 may be a voltage during programming referred to as PROGSRC (e.g., approximately 2 V). During sensing (e.g., read or verify), the CELSRC voltage 774 may be referred to as VCELSRC (e.g., approximately 1 V). For one or more storage elements (e.g., memory cells) that are not being programmed, the inhibit bit line voltage 758 inhibits programming during inhibit (INH) pulses. For one or more storage elements (e.g., memory cells) being programmed, the program bit line voltages 760*a-c* are held low (0 V) to allow a charge to accumulate on the floating gate during a program pulse (VP) on a selected word line. In this example, storage elements (e.g., memory cells) being programmed 761 to particular states (referred to as "A-state," "B-state," and "C-state") as indicated by the bit line voltages 760*a-c*.

As illustrated in FIG. 7, program bit line voltages 760*a-c* are held low (0 V) and an inhibit bit line voltage 758 is raised while the selected word line voltage 762 includes a program pulse (VP). In an embodiment, a number of program pulses (VP) may be delivered on a selected word line before verify pulses (Verify) are delivered to the selected word line for a particular state. Bit line pulses (VB) are delivered in the inhibit bit line voltage 758 and the program bit line voltages 760*a-c* coincident with the verify pulses (AV, ABV, BCV, CV).

In an embodiment, state-dependent fine programming is performed as illustrated in FIG. 7. The damping circuit 234 may deliver damping pulses with increasing periods depending on the state being programmed. For example, a first bit line voltage 760*a* is stepped up (e.g., damping pulses 764*a-c* are delivered) during programming (e.g., PD1 or programming clock). The period of damping pulses 764*a-c* increases (e.g., from 1 is to 3 μs) during A-state fine programming. A second bit line voltage 760*b* is stepped up (e.g., damping pulses 764*d-f* are delivered) during programming (e.g., PD1 or programming clock). The period of damping pulses 764*d-f* increases (e.g., from 1 is to 3 μs) during B-state fine programming. A third bit line voltage 760*c* is stepped up (e.g., damping pulses 764*g-i* are delivered) during programming (e.g., PD1 or programming clock). The period of damping pulses 764*g-i* increases (e.g., from 1 is to 3 μs) during C-state fine programming. As illustrated in FIG. 7, fine programming may overlap between states. For example, the B-state is at a higher threshold voltage than the A-state, and the C-state is at a higher threshold voltage than the B-state. Accordingly, A-state fine programming (e.g., damping pulse 764*a*) occurs before B-state fine programming (e.g., damping pulse 764*d*), which occurs before C-state fine programming (e.g., damping pulse 764*g*).

Figure 8:
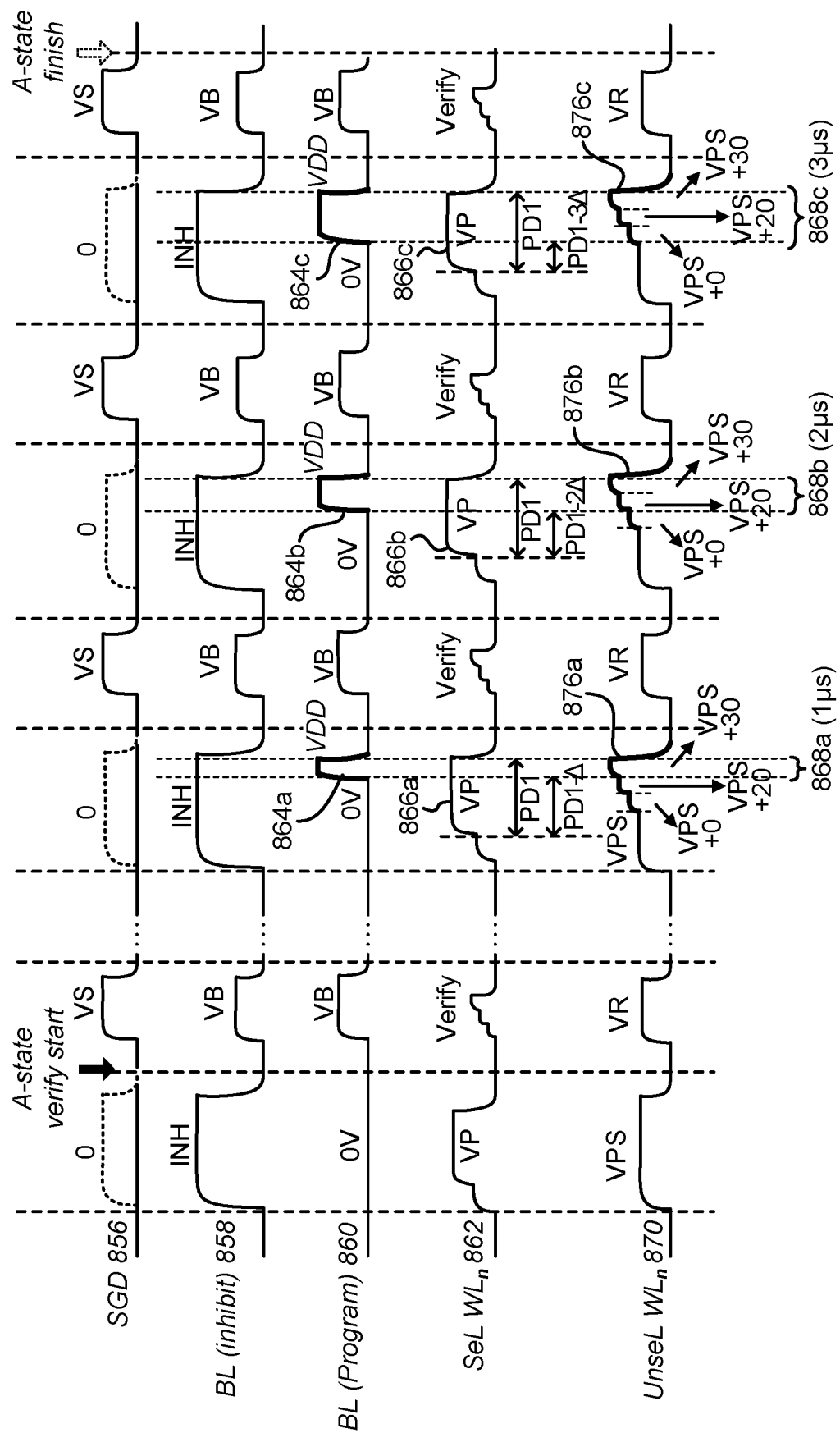
FIG. 8 is a timing diagram illustrating an example of pass pulse boosting during program pulses.

FIG. 8 is a timing diagram illustrating an example of pass pulse boosting during program pulses. The timing diagram includes a drain select gate (SGD) voltage 856, an inhibit bit line (BL) voltage 858, a program bit line (BL) voltage 860, a selected word line (SeL WL$_n$) voltage 862, and an unselected word line (UnseL WL$_n$) voltage 870 over time. In an embodiment, the programming circuit 230 delivers program pulses (VP) to the selected word line, the sensing circuit 232 delivers verify pulses (Verify) to the selected word line, and the damping circuit 234 delivers damping pulses to the bit line(s) being programmed. The verify pulses may be at one or more different levels to verify different states. In an embodiment, a pass circuit delivers pass pulses (VPS or VPASS) and/or read pulses (VR or VREAD) to unselected word lines. For example, the unselected word line voltages 870 include pass pulses coincident with (e.g., concurrent with) program pulses (VP) on the selected word line, and/or include read pulses coincident with (e.g., concurrent with) verify pulses on the selected word line. For one or more storage elements (e.g., memory cells) that are not being programmed, the inhibit bit line voltage 858 inhibits programming during inhibit (INH) pulses. For one or more storage elements (e.g., memory cells) being programmed, the program bit line voltage 860 is held low (0 V) to allow a charge to accumulate on the floating gate during a program pulse (VP) on a selected word line. In this example, a storage element (e.g., memory cell) is being programmed to a particular state (referred to as "A-state").

As illustrated in FIG. 8, a program bit line voltage 860 is held low (0 V) and an inhibit bit line voltage 858 is raised while the selected word line voltage 862 includes a program pulse (VP). In an embodiment, a number of program pulses (VP) may be delivered on a selected word line and/or a number of pass pulses (VPS) may be delivered on unselected word lines before verify pulses (Verify) are delivered to the selected word line. Bit line pulses (VB) are delivered in the inhibit bit line voltage 858 and the program bit line voltage 860 coincident with the verify pulses.

When voltages of storage elements (e.g., memory cells) are distant from corresponding target voltages (e.g., before a trigger threshold voltage is satisfied), the program bit line voltage 860 is 0 V (coincident with program pulses of the selected word line voltage 862). When storage elements (e.g., memory cells) are close to the corresponding target voltages (e.g., when a trigger threshold voltage is satisfied), the program bit line voltage 860 (e.g., BL bias) will step up after initiation of and during corresponding program pulses (VP). For example, the damping circuit 234 steps up the program bit line voltage 860 to approximately VDD, 3 V, or another voltage (e.g., the damping pulses have amplitudes of approximately 3 V or VDD). In an embodiment, each program pulse 866*a-c* is initiated each time the selected word line voltage 862 increases from a baseline voltage, a step voltage, or another voltage (e.g., 0 V, 10 V) for programming (e.g., and not for verification). For example, each program pulse 866*a-c* begins with a step and later increases to a program pulse peak. As illustrated in FIG. 8, the program pulse peak increases over a series of programming cycles in an embodiment. In the example of FIG. 8, PD1 corresponds to a period of (or duration of) a program pulse peak for each program pulse 866*a-c*.

In an embodiment, the damping circuit 234 is configured to (after a voltage of the memory cell satisfies the trigger threshold voltage) progressively increase a period A of damping pulses on the bit line being programmed after initiation of and during each of the respective program pulses. As illustrated in FIG. 8, each damping pulse 864a-c starts after initiation of and during a corresponding program pulse 866a-c. In the example of FIG. 8, a first damping pulse 864a corresponds to a first program pulse 866a, has a first period 868a, and/or begins at PD1-Δ (e.g., PD1—1 μs) for a first cycle. A second damping pulse 864b corresponds to a second program pulse 866b, has a second period 868b, and/or begins at PD1-2Δ (e.g., PD1—2 μs) for a second cycle. A third damping pulse 864c corresponds to a third program pulse 866c, has a third period 868c, and/or begins at PD1-3Δ (e.g., PD1—3 μs) for a third cycle. This procedure is repeated until the states are completely formed (e.g., until the memory cells are completely programmed). In the example of FIG. 8, the procedure repeats until the A-state programming is finished.

In this example, the periods 868a-c of the damping pulses 864a-c increase in duration over programming cycles. In an embodiment, the increase in duration may uniform (e.g., +1 is per programming cycle). Each damping pulse 864a-c begins after initiation of and during corresponding program pulses 866a-c. Each damping pulse 864a-c progressively reduces corresponding effective program pulse length (to PD1-Δ, then PD1-2Δ, and then PD1-3Δ). Accordingly, the programming speed of the storage elements (e.g., memory cells) is increasingly slowed.

In an embodiment, the pass circuit (included in the read/write circuit 228, for example), is configured to increase pass pulses to unselected word lines after initiation of and curing at least one of the program pulses. In the example of FIG. 8, after the voltage of the memory cell satisfies the trigger threshold voltage, the pass circuit increases the pass pulses 876a-c in the unselected word line voltage 870. In an embodiment, the pass circuit incrementally increases at least one of the pass pulses (to the unselected word lines) after initiation of and during at least one of the program pulses. The incremental increases may be uniform (e.g., by a voltage δ) or different. The incremental increases may be performed in a series of steps, where each step has a period. Each period may be the same or different in duration. For example, each step period may correspond to the damping pulse period changes over a number of programming cycles. For example, the period of each of the damping pulses 864a-c is equal to a total of one or more of the periods of the steps of the (stepped-up) pass pulses 876a-c. As illustrated in FIG. 8, the periods and/or amplitude of the steps of the (stepped-up) pass pulses 876a-c linearly increase. In an alternative embodiment (not illustrated), the periods and/or amplitude of these steps of the (stepped-up) pass pulses 876a-c non-linearly increase.

In the example illustrated in FIG. 8, the pass circuit is configured to increase the pass pulses 876a-c in a plurality of steps during the program pulses 866a-c, where each step has a period. For example, each stepped-up pass pulse 876a-c steps up progressively at PD1-3Δ, PD1-2Δ, PD1-1Δ to VPASS+δ, VPASS+2δ, VPASS+3δ. The stepped-up pass pulses 876a-c may provide additional pass pulse boosting (e.g., channel boosting) to make the channel potential greater than the drain select gate voltage (VSGD) minus the threshold voltage of a drain select gate transistor (e.g., VSGD-Vt).

Figure 9:
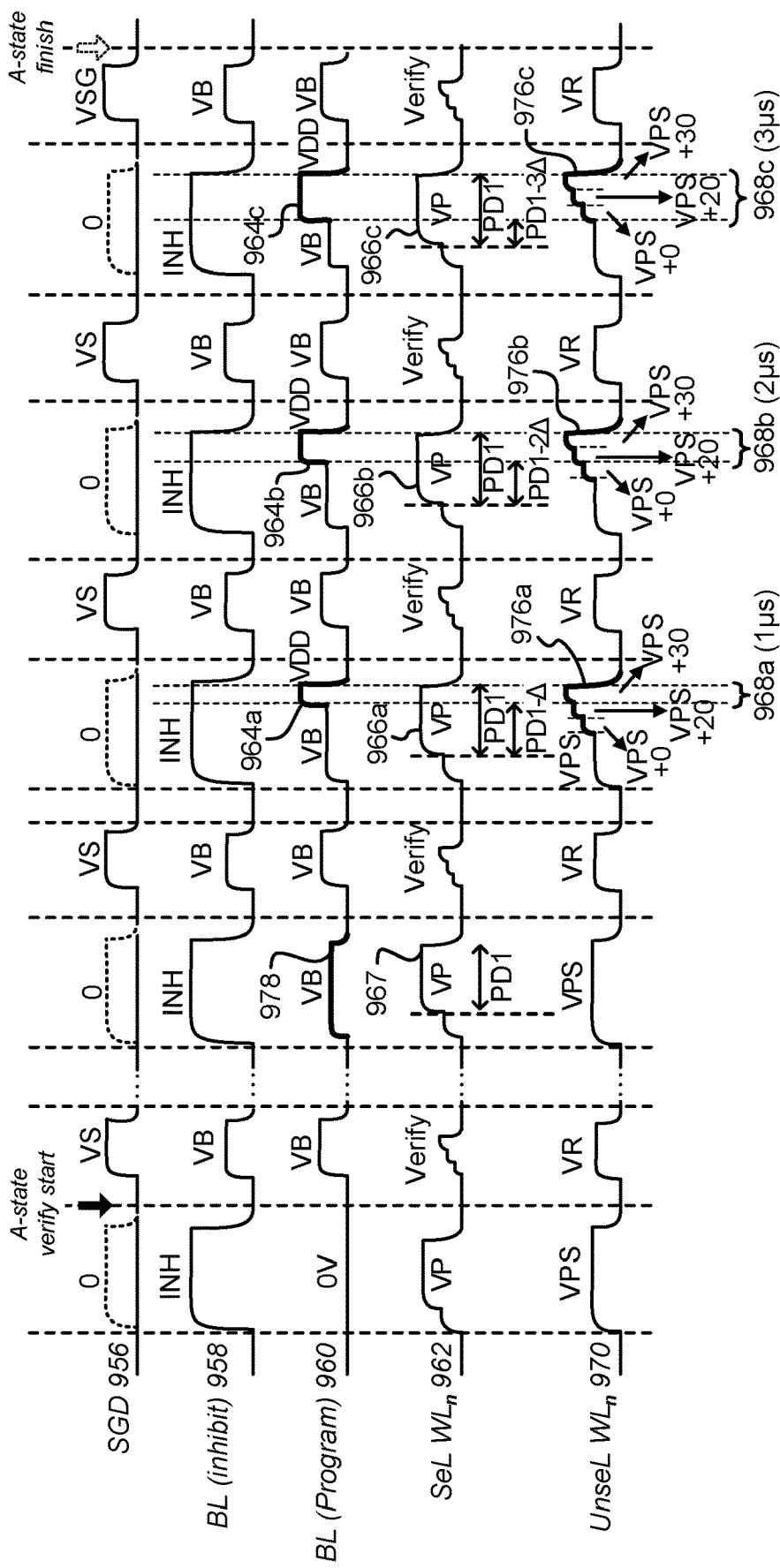
FIG. 9 is a timing diagram illustrating another example of pass pulse boosting during program pulses.

FIG. 9 is a timing diagram illustrating another example of pass pulse boosting during program pulses. The timing diagram includes a drain select gate (SGD) voltage 956, an inhibit bit line (BL) voltage 958, a program bit line (BL) voltage 960, a selected word line (SeL WL$_n$) voltage 962, and an unselected word line (UnseL WL$_n$) voltage 970 over time. In an embodiment, the programming circuit 230 delivers program pulses (VP) to the selected word line, the sensing circuit 232 delivers verify pulses (Verify) to the selected word line, and the damping circuit 234 delivers damping pulses to the bit line(s) being programmed. The verify pulses may be at one or more different levels to verify different states. In an embodiment, a pass circuit delivers pass pulses (VPS or VPASS) and/or read pulses (VR or VREAD) to unselected word lines. For example, the unselected word line voltages 970 include pass pulses coincident with (e.g., concurrent with) program pulses (VP) on the selected word line, and/or include read pulses coincident with (e.g., concurrent with) verify pulses on the selected word line. For one or more storage elements (e.g., memory cells) that are not being programmed, the inhibit bit line voltage 958 inhibits programming during inhibit (INH) pulses. For one or more storage elements (e.g., memory cells) being programmed, the program bit line voltage 960 is held low (0 V) to allow a charge to accumulate on the floating gate during a program pulse (VP) on a selected word line. In this example, a storage element (e.g., memory cell) is being programmed to a particular state (referred to as "A-state").

As illustrated in FIG. 9, a program bit line voltage 960 is held low (0 V) and an inhibit bit line voltage 958 is raised while the selected word line voltage 962 includes a program pulse (VP). In an embodiment, a number of program pulses (VP) may be delivered on a selected word line and/or a number of pass pulses (VPS) may be delivered on unselected word lines before verify pulses (Verify) are delivered to the selected word line. Bit line pulses (VB) are delivered in the inhibit bit line voltage 958 and the program bit line voltage 960 coincident with the verify pulses.

When voltages of storage elements (e.g., memory cells) are distant from corresponding target voltages (e.g., before a trigger threshold voltage is satisfied), the program bit line voltage 960 is 0 V (coincident with program pulses of the selected word line voltage 962). When storage elements (e.g., memory cells) are close to the corresponding target voltages (e.g., when a trigger threshold voltage is satisfied), the damping circuit 234 steps up the program bit line voltage 960 (e.g., BL bias) with a corresponding program pulse (VP) for one or more program pulses. In an embodiment, the program bit line voltage 960 is increased or stepped up at substantially the same time as the corresponding increase on the selected word line. For example, a damping pulse 978 (e.g., one damping pulse) is delivered to the bit line being programmed at substantially the same time as (or simultaneously with) an increase (e.g., step) in the selected word line voltage 962. A programming pulse 967 may occur coincident with the damping pulse 978. The damping pulse 978 may be initially at a first amplitude (e.g., 0.5 V or another voltage). After initiation of and during the same, or one or more subsequent program pulses, the damping circuit 234 (further) increases or steps up a damping pulse on the bit line being programmed. For example, damping pulses are increased 964a-c or stepped up (e.g., to 1 V or another voltage) after initiation of and during corresponding program pulses 966a-c.

For example, the damping circuit 234 subsequently steps up the program bit line voltage 960 to approximately VDD, 3 V, or another voltage (e.g., the damping pulses have amplitudes of approximately 3 V or VDD). In an embodiment, each program pulse 966a-c is initiated each time the selected word line voltage 962 increases from a baseline voltage, a step voltage, or another voltage (e.g., 0 V, 10 V, or another voltage) for programming (e.g., and not for verification). For example, each program pulse 966a-c begins with a step and later increases to a program pulse peak. The program pulse peak increases over a series of programming cycles in an embodiment. In the example of FIG. 9, PD1 corresponds to a period of (or duration of) a program pulse peak for each program pulse 966a-c.

In an embodiment, the damping circuit 234 is configured to (after a voltage of the memory cell satisfies the trigger threshold voltage) progressively increase a period A of damping pulses on the bit line being programmed after initiation of and during each of the respective program pulses. As illustrated in FIG. 9, damping pulses are increased or stepped up after initiation of and during a corresponding program pulse 966a-c. In the example of FIG. 9, a first damping pulse increase 964a corresponds to a first program pulse 966a, has a first period 968a, and/or begins at PD1-Δ (e.g., PD1—1 µs) for a first cycle. A second damping pulse increase 964b corresponds to a second program pulse 966b, has a second period 968b, and/or begins at PD1-2Δ (e.g., PD1—2 µs) for a second cycle. A third damping pulse increase 964c corresponds to a third program pulse 966c, has a third period 968c, and/or begins at PD1-3Δ (e.g., PD1—3 µs) for a third cycle. In an example, one damping pulse 978 at a first level (e.g., 0.5 V) is initially delivered coincidentally (e.g., concurrently with) a program pulse 967. With the following program pulses 966a-c, the damping circuit 234 later steps up the bit line voltage 960 to a high value (e.g., 3 V, VDD) to completely stop the programming. This procedure is repeated until the states are completely formed (e.g., until the memory cells are completely programmed). In the example of FIG. 9, the procedure repeats until the A-state programming is finished.

In this example, the periods 968a-c of the damping pulse increases 964a-c increase in duration over programming cycles. In an embodiment, the increase in duration may be uniform (e.g., +1 is per programming cycle). The damping pulse increases 964a-c begin after initiation of and during corresponding program pulses 966a-c. Damping pulse increases 964a-c progressively reduce corresponding effective program pulse length (to PD1-Δ, then PD1-2Δ, and then PD1-3Δ). Accordingly, the programming speed of the storage elements (e.g., memory cells) is increasingly slowed.

In an embodiment, the pass circuit (included in read/write circuit 228, for example), is configured to increase pass pulses to unselected word lines after initiation of and curing at least one of the program pulses. In the example of FIG. 9, after the voltage of the memory cell satisfies the trigger threshold voltage, the pass circuit increases the pass pulses 976a-c in the unselected word line voltage 970. For example, the pass pulses 976a-c may be stepped up as described in connection with FIG. 8.

Figure 10:
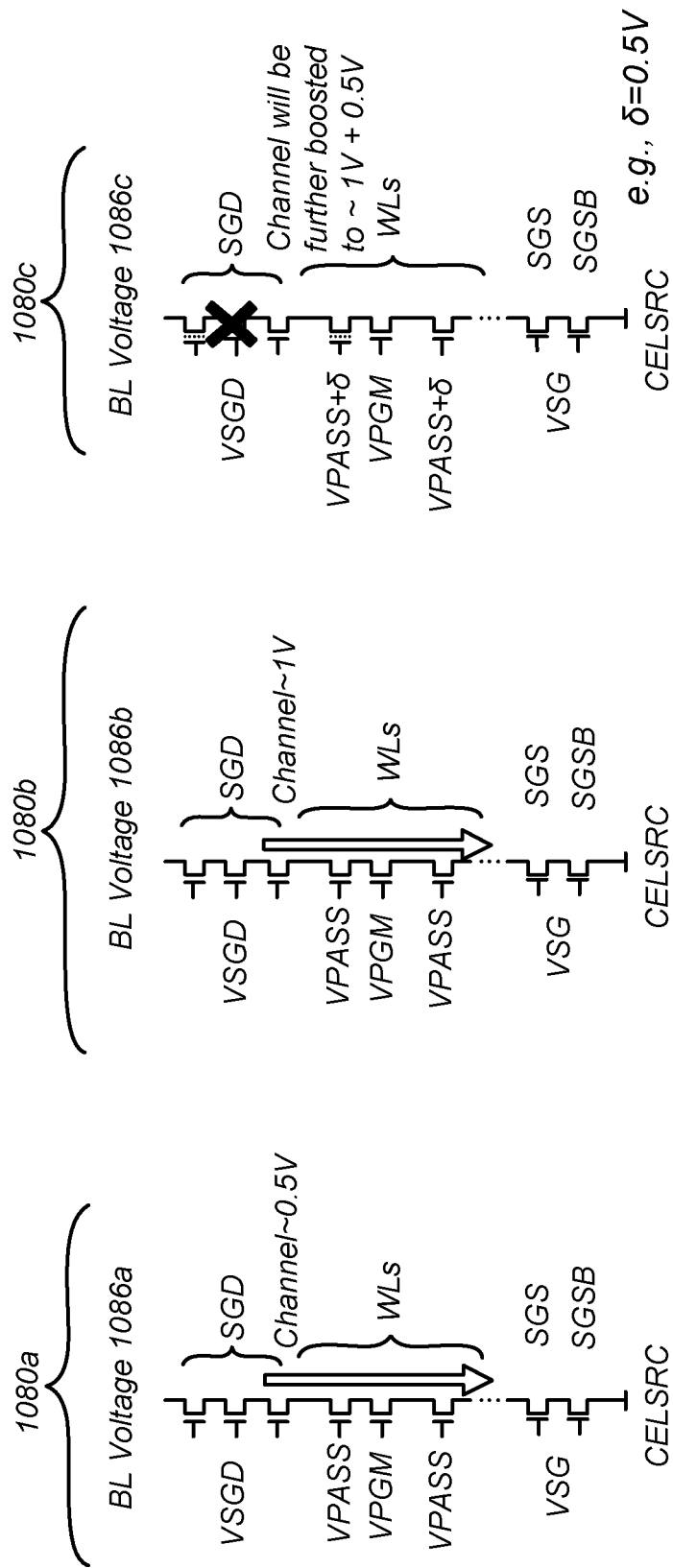
FIG. 10 is a diagram illustrating an example of pass pulse boosting.

FIG. 10 is a diagram illustrating an example of pass pulse boosting. FIG. 10 illustrates examples 1080a-c of a bit line at different times. Due to VSGD margin (e.g., the common voltage on SGD to ensure program/inhibit) and without pass pulse boosting, channel potential may be clamped at VSGD-V≈1V even though the bit line voltage may be further increased to VDD≈3V.

To allow channel voltage to further increase (which may help to completely stop weak programming), a pass pulse step-up assisted boosting technique during one or more program pulses (e.g., with duration PD1) can be used. After channel potential is clamped at a voltage (e.g., VSGD-Vt≈1V), the pass circuit delivers a step-up voltage on the pass pulse (e.g., VPASS+δ), which allows the channel to further boost by δ, which may achieve a more effective program pulse inhibit.

In an example, the bit line 1080a initially has bit line voltage 1086a of 0 V before a damping pulse. At this time, the unselected word line voltages are at VPASS (e.g., 10V). This results in a channel voltage at 0 V. At this moment, for example, SGD is turned on, so the bitline voltage 0 V is completely transferred to channel potential/voltage. Then, the bit line 1080b has a bit line voltage 1086b increased to VSGD-Vt≈1V (during a damping pulse, for example). At this time, the unselected word line voltages are maintained (e.g., at VPASS). This results in a channel at approximately 1 V, for example. Then, the bit line 1080c has a bit line voltage 1086c increased to VDD (during a damping pulse, for example). At this time, the unselected word line voltages are increased (e.g., to VPASS+δ or VPASS+0.5V). This results in a channel at approximately 1.5 V (e.g., 1 V+0.5 V), for example. As illustrated in FIG. 8, for instance, a bit line may initially have a voltage of 0 V, which is then stepped up to VDD while an unselected word line voltage is also increased.

In another example, the bit line 1080a initially has bit line voltage 1086a of 0.5 V. At this time, the unselected word line voltages are at VPASS (e.g., 10V). This results in a channel (at approximately 0.5 V, for example). Then, the bit line 1080b has a bit line voltage 1086b increased to VSGD-Vt≈1V (during a damping pulse, for example). At this time, the unselected word line voltages are maintained (e.g., at VPASS). This results in a channel at approximately 1 V, for example. Then, the bit line 1080c has a bit line voltage 1086c increased to VDD (during the damping pulse increase). At this time, the unselected word line voltages are increased (e.g., to VPASS+δ or VPASS+0.5V). This results in a channel at approximately 1.5 V (e.g., 1 V+0.5 V), for example. As illustrated in FIG. 9, for instance, a bit line may initially have a voltage of 0.5 V, which is then stepped up to VDD while an unselected word line voltage is also increased.

One embodiment of an apparatus described herein includes a programming circuit configured to supply a program pulse to increase a threshold voltage of a memory cell. The apparatus also includes a sensing circuit configured to determine that the threshold voltage of the memory cell satisfies a trigger threshold voltage in response to the program pulse. The apparatus further includes a damping circuit configured to increase a voltage of a bit line connected to the memory cell after initiation of and during a second program pulse in response to the threshold voltage of the memory cell satisfying the trigger threshold voltage. The second program pulse is sent by the programming circuit.

In an embodiment, the damping circuit is configured to increase the voltage of the bit line after at least 25% of a period for the program pulse passes. In an embodiment, the damping circuit is configured to increase the voltage of the bit line after at least 50% of the period of the program pulse passes. In an embodiment, the damping circuit is configured to stop increasing the voltage of the bit line simultaneous with termination of the program pulse.

The apparatus, in an embodiment, further includes a pass circuit configured to increase a voltage of unselected word lines after the initiation of and during the program pulse. In an embodiment, the sensing circuit is configured to send one or more verify pulses to verify the threshold voltage of the memory cell until the threshold voltage reaches a target threshold voltage. In an embodiment, the programming circuit is configured to supply a third program pulse to the memory cell after sending the second program pulse, and the damping circuit is configured to increase of the voltage of the bit line after initiation of and during the third program pulse for a greater period than the voltage of the bit line increased during the second program pulse.

An embodiment of a write circuit is also described. The write circuit is configured to deliver write pulses alternating with verify pulses to a selected word line to incrementally program a memory cell connected to the selected word line to a target voltage. A trigger threshold voltage is offset from the target voltage. The write circuit is also configured to send bit line pulses to a bit line for the memory cell after a voltage of the memory cell satisfies the trigger threshold voltage. Each of the bit line pulses starts after initiation of and during each respective write pulse, and a period of each of the bit line pulses increases as the voltage of the memory cell approaches the target voltage.

In an embodiment, the write circuit is further configured to step up at least one pass pulse to unselected word lines after initiation of and during a coincident write pulse. In an embodiment, the write circuit is further configured to send at least one of the bit line pulses to the bit line after at least 25% of a period of a respective write pulse passes.

An embodiment of a non-volatile storage system is also described herein. The non-volatile storage system includes a programming circuit configured to deliver program pulses through a selected word line connected to an array of memory cells to program a memory cell to a target voltage. A trigger threshold voltage is offset from the target voltage. The non-volatile storage system also includes a damping circuit configured to, after a voltage of the memory cell satisfies the trigger threshold voltage, progressively increase a period of damping pulses on a bit line connected to the memory cell after initiation and during each of the respective program pulses. The non-volatile storage system additionally includes a pass circuit configured to, after the voltage of the memory cell satisfies the trigger threshold voltage, increase pass pulses to unselected word lines after initiation of and during at least one of the program pulses.

In an embodiment, the pass circuit is configured to incrementally increase at least one of the pass pulses to unselected word lines after initiation of and during at least one of the program pulses. In an embodiment, the pass circuit is configured to increase at least one of the pass pulses in a plurality of steps during at least one of the program pulses, each step having a period. In an embodiment, the period each of the damping pulses is equal to a total of one or more of the periods of the steps of the pass pulses. The non-volatile storage system, in an embodiment, further includes a sensing circuit configured to send a verify pulse to the memory cell between delivery of at least two of the program pulses.

An embodiment of a method is also described. The method includes generating a program pulse. The method also includes delivering the program pulse to a memory cell in a memory array to incrementally increase a threshold voltage to a target threshold voltage after the memory cell satisfies a trigger threshold voltage. The trigger threshold voltage is offset from the target voltage threshold. The method further includes sending a damping pulse to a bit line for the memory cell coincident with the program pulse. The method additionally includes stepping up, for a period, the damping pulse during the program pulse.

In an embodiment, the method includes generating a second program pulse and delivering the second program pulse to the memory cell after the program pulse is delivered to the memory cell. In this embodiment, the method also includes sending a second damping pulse to a bit line for the memory cell concurrently with a second program pulse on a selected word line and stepping up, for a second period, the second damping pulse during the second program pulse. The second period is greater than the period.

In an embodiment, an amplitude of the stepped-up portion of the second damping pulse is greater than an amplitude of the stepped-up portion of the damping pulse. In an embodiment, the method includes sending the damping pulse to the bit line for the memory cell after at least 25% of a period of a coincident program pulse passes.

An embodiment of an apparatus is also described. The apparatus includes a memory die comprising a memory cell. The apparatus also includes means for producing a series of program pulses on a selected word line of a block of the memory die to program the memory cell to a target voltage. A trigger threshold voltage is offset from the target voltage. The apparatus also includes means for producing a series of elevated pulses to a bit line for the memory cell after a voltage level of the memory cell satisfies the trigger threshold voltage, a period of each elevated pulse increasing as a voltage level of the memory cell approaches the target voltage, each elevated pulse commencing after initiation of and during a coincident program pulse. The apparatus further includes means for stepping up a pass pulse on an unselected word line after initiation of and during at least one program pulse after the voltage level of the memory cell satisfies the trigger threshold voltage.

In an embodiment, the means for stepping up the pass pulse on the unselected word line includes means for stepping up the pass pulse as a plurality of stepped amplitudes during a coincident program pulse. In an embodiment, the means for producing is configured to send at least one of the elevated pulses to the bit line for the memory cell after at least 25% of a period of a coincident program pulse passes.

A means for producing a series of program pulses on a selected word line of a block of the memory die to program the memory cell to a target voltage, in one embodiment, may include a memory device 222, a memory die 224, read/write circuits 228, programming circuit 230, control circuitry 210, state machine 212, and/or other hardware. Other embodiments may include similar or equivalent means for producing a series of program pulses on a selected word line of a block of the memory die to program the memory cell to a target voltage.

A means for producing a series of elevated pulses to a bit line for the memory cell after a voltage level of the memory cell satisfies the trigger threshold voltage, a period of each elevated pulse increasing as a voltage level of the memory cell approaches the target voltage, each elevated pulse commencing after initiation of and during a coincident program pulse, in one embodiment, may include a memory device 222, a memory die 224, read/write circuits 228, programming circuit 230, sensing circuit 232, damping circuit 234, control circuitry 210, state machine 212, and/or other hardware. Other embodiments may include similar or equivalent means for producing a series of elevated pulses to a bit line for the memory cell after a voltage level of the memory cell satisfies the trigger threshold voltage, a period of each elevated pulse increasing as a voltage level of the memory cell approaches the target voltage, each elevated pulse commencing after initiation of and during a coincident program pulse.

A means for stepping up a pass pulse on an unselected word line after initiation of and during at least one program pulse after the voltage level of the memory cell satisfies the trigger threshold voltage, in one embodiment, may include a memory device 222, a memory die 224, read/write circuits 228, programming circuit 230, sensing circuit 232, damping circuit 234, control circuitry 210, state machine 212, and/or other hardware. Other embodiments may include similar or equivalent means for stepping up a pass pulse on an unselected word line after initiation of and during at least one program pulse after the voltage level of the memory cell satisfies the trigger threshold voltage.

As used in this application, the terms "an embodiment," "one embodiment," "another embodiment," or analogous language do not refer to a single variation of the disclosed subject matter; instead, this language refers to variations of the disclosed subject matter that may be applied and used with a number of different implementations of the disclosed subject matter.

One of skill in the art will recognize that this disclosure is not limited to the two-dimensional and three-dimensional exemplary structures described but cover all relevant memory structures within the spirit and scope of the disclosure as described herein and as understood by one of skill in the art. The illustrations of the embodiments described herein are intended to provide a general understanding of the embodiments. Other embodiments may be utilized and derived from the disclosure, such that structural and logical substitutions and changes may be made without departing from the scope of the disclosure. This disclosure is intended to cover any and all subsequent adaptations or variations of embodiments. Those of skill in the art will recognize that such modifications are within the scope of the present disclosure.

The above-disclosed subject matter is to be considered illustrative, and not restrictive, and the appended claims are intended to cover all such modifications, enhancements, and other embodiments, that fall within the scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. An apparatus, comprising:
    a programming circuit that supplies a first program pulse to increase a threshold voltage of a memory cell;
    a sensing circuit that determines that the threshold voltage of the memory cell satisfies a trigger threshold voltage in response to the first program pulse;
    a damping circuit that increases a voltage of a bit line connected to the memory cell during a second program pulse and after a period of the second program pulse passes in response to the threshold voltage of the memory cell satisfying the trigger threshold voltage, the second program pulse being sent by the programming circuit; and
    a pass circuit that increases a voltage of an unselected word line after initiation of and during the second program pulse.

2. The apparatus of claim 1, wherein the damping circuit increases the voltage of the bit line after at least 25% of the period for the second program pulse passes.

3. The apparatus of claim 1, wherein the damping circuit increases the voltage of the bit line after at least 50% of the period of the second program pulse passes.

4. The apparatus of claim 1, wherein the damping circuit stops increasing the voltage of the bit line simultaneous with termination of the second program pulse.

5. The apparatus of claim 1, wherein the sensing circuit sends one or more verify pulses to verify the threshold voltage of the memory cell until the threshold voltage reaches a target threshold voltage.

6. The apparatus of claim 1, where in the programming circuit supplies a third program pulse to the memory cell after supplying the second program pulse, and wherein the damping circuit increases the voltage of the bit line after initiation of and during the third program pulse for a greater period than the voltage of the bit line increased during the second program pulse.

7. A write circuit configured to:
    deliver write pulses alternating with verify pulses to a selected word line to incrementally program a memory cell connected to the selected word line to a target voltage, wherein a trigger threshold voltage is offset from the target voltage;
    send bit line pulses to a bit line for the memory cell after a voltage of the memory cell satisfies the trigger threshold voltage, wherein each of the bit line pulses starts during each respective write pulse and after a first period of the each respective write pulse passes, and a second period of each of the bit line pulses increases as the voltage of the memory cell approaches the target voltage; and
    step up at least one pass pulse to unselected word lines after initiation of and during a coincident write pulse.

8. The write circuit of claim 7, wherein the write circuit sends at least one of the bit line pulses to the bit line after at least 25% of the first period of a respective write pulse passes.

9. A non-volatile storage system, comprising:
    a programming circuit configured to deliver program pulses through a selected word line connected to an array of memory cells to program a memory cell to a target voltage, wherein a trigger threshold voltage is offset from the target voltage;
    a damping circuit configured to, after a voltage of the memory cell satisfies the trigger threshold voltage, progressively increase a period of damping pulses on a bit line connected to the memory cell after initiation and during each of the respective program pulses; and
    a pass circuit configured to, after the voltage of the memory cell satisfies the trigger threshold voltage, increase pass pulses to unselected word lines after initiation of and during at least one of the program pulses.

10. The non-volatile storage system of claim 9, wherein the pass circuit is configured to incrementally increase at least one of the pass pulses to unselected word lines after initiation of and during at least one of the program pulses.

11. The non-volatile storage system of claim 10, wherein the pass circuit is configured to increase at least one of the pass pulses in a plurality of steps during at least one of the program pulses, each step having a period.

12. The non-volatile storage system of claim 11, wherein the period each of the damping pulses is equal to a total of one or more of the periods of the steps of the pass pulses.

13. The non-volatile storage system of claim 9, further comprising a sensing circuit configured to send a verify pulse to the memory cell between delivery of a least two of the program pulses.

14. A method, comprising:
    generating a program pulse;
    delivering the program pulse to a memory cell in a memory array to incrementally increase a threshold voltage to a target threshold voltage after the memory cell satisfies a trigger threshold voltage, wherein the trigger threshold voltage is offset from the target voltage threshold;

sending a damping pulse to a bit line for the memory cell coincident with the program pulse; and stepping up, for a period, the damping pulse during the program pulse.

15. The method of claim 14, further comprising:

generating a second program pulse delivering the second program pulse to the memory cell after the program pulse is delivered to the memory cell;

sending a second damping pulse to a bit line for the memory cell concurrently with second program pulse on a selected word line; and stepping up, for a second period, of the second damping pulse during the second program pulse, wherein the second period is greater than the period.

16. The method of claim 15, wherein an amplitude of the stepped-up portion of the second damping pulse is greater than an amplitude of the stepped-up portion of the damping pulse.

17. The method of claim 14, further comprising sending the damping pulse to the bit line for the memory cell after at least 25% of a period of a coincident program pulse passes.

18. An apparatus, comprising:

a memory die comprising a memory cell;

means for producing a series of program pulses on a selected word line of a block of the memory die to program the memory cell to a target voltage, wherein a trigger threshold voltage is offset from the target voltage;

means for producing a series of elevated pulses to a bit line for the memory cell after a voltage level of the memory cell satisfies the trigger threshold voltage, a period of each elevated pulse increasing as a voltage level of the memory cell approaches the target voltage, each elevated pulse commencing after initiation of and during a coincident program pulse; and means for stepping up a pass pulse on an unselected word line after initiation of and during at least one program pulse after the voltage level of the memory cell satisfies the trigger threshold voltage.

19. The apparatus of claim 18, wherein the means for stepping up the pass pulse on the unselected word line comprises means for stepping up the pass pulse as a plurality of stepped amplitudes during a coincident program pulse.

20. The apparatus of claim 18, wherein the means for producing is configured to send at least one of the elevated pulses to the bit line for the memory cell after at least 25% of a period of a coincident program pulse passes.

* * * * *